(12) United States Patent
Mochizuki et al.

(10) Patent No.: US 7,906,796 B2
(45) Date of Patent: Mar. 15, 2011

(54) BIPOLAR DEVICE AND FABRICATION METHOD THEREOF

(75) Inventors: Kazuhiro Mochizuki, Tokyo (JP); Hidekatsu Onose, Hitachi (JP); Natsuki Yokoyama, Mitaka (JP)

(73) Assignee: Hitachi, Ltd., Tokyo (JP)

( * ) Notice: Subject to any disclaimer, the term of this patent is extended or adjusted under 35 U.S.C. 154(b) by 337 days.

(21) Appl. No.: 12/176,635

(22) Filed: Jul. 21, 2008

(65) Prior Publication Data
US 2009/0057685 A1      Mar. 5, 2009

(30) Foreign Application Priority Data
Aug. 29, 2007   (JP) .................................. 2007-222455

(51) Int. Cl.
*H01L 29/74* (2006.01)
(52) U.S. Cl. ........ 257/164; 257/152; 257/156; 257/198; 257/583; 257/E29.191
(58) Field of Classification Search ............ 257/164, 257/152, 156, 198, 583, E29.191
See application file for complete search history.

(56) References Cited

U.S. PATENT DOCUMENTS
| | | | |
|---|---|---|---|
| 5,539,217 A | 7/1996 | Edmond et al. | |
| 2010/0001290 A1* | 1/2010 | Nonaka ........................... | 257/77 |

FOREIGN PATENT DOCUMENTS
JP        2006-351621 A     12/2006

OTHER PUBLICATIONS
Ivanov et al., "Factors limiting the current gain in high-voltage 4H-SiC npn-BJTs", Solid-State Electronics, vol. 46 (2002), pp. 567-572.

* cited by examiner

*Primary Examiner* — Tu-Tu V Ho
(74) *Attorney, Agent, or Firm* — Miles & Stockbridge P.C.

(57) ABSTRACT

In a bipolar device, such as transistor or a thyristor, the emitter layer or the anode layer is formed of two high-doped and low-doped layers, a semiconductor region for suppressing recombination comprising an identical semiconductor having an impurity density identical with that of the low-doped layer is present being in contact with a base layer or a gate layer and a surface passivation layer, and the width of the semiconductor region for suppressing recombination is defined equal with or longer than the diffusion length of the carrier. This provides, among other things, an effect of attaining reduction in the size of the bipolar transistor or improvement of the switching frequency of the thyristor without deteriorating the performance.

15 Claims, 16 Drawing Sheets

71  72
(ONLY PERIPHERY IS SHOWN BY
THE BROKEN LINE)

Tr1 & Tr2: SiC BJT CHIPS
D1: SiC SCHOTTKY BARRIER DIODE CHIP (a) FIG. 3 SCHEMATIC BAND DIAGRAM AT B-B' SECTION (b) FIG. 5 SCHEMATIC BAND DIAGRAM AT C-C' SECTION (c) FIG. 1 SCHEMATIC BAND DIAGRAM AT A-A' SECTION

BIPOLAR DEVICE AND FABRICATION METHOD THEREOF

CLAIM OF PRIORITY

The present application claims priority from Japanese patent application JP 2007-222455 filed on Aug. 29, 2007, the content of which is hereby incorporated by reference into this application.

FIELD OF THE INVENTION

The present invention relates to a bipolar device typically represented by a bipolar transistor and a thyristor. The bipolar device of the present application is useful, particularly, for a power bipolar device of a reduced sized or capable of high frequency switching.

BACKGROUND OF THE INVENTION

In an existent power bipolar transistor for power application use, SiC is used as a semiconductor material, and a collector layer, a base layer and an emitter layer are arranged, for example, as shown in FIG. 3. FIG. 3 as a typical example is a vertical cross sectional structural view of the device. On an n-type substrate 91, a collector layer 92 having a donor density of about $2.5 \times 10^{15}$ cm$^{-3}$, a base layer 93 having an acceptor density of about $3 \times 10^{17}$ cm$^{-3}$, and an emitter layer 95 having a donor density of about $1 \times 10^{19}$ cm$^{-3}$ are epitaxially grown. A mesa structure 103 having an emitter layer 95 and a base layer 93 is formed to the stack. Then, a base electrode 100 is formed by way of a base contact region 97 in which high doped acceptor is generated by ion implantation and activation annealing. Further, an emitter electrode 99 is disposed directly to the emitter layer 95 and a collector electrode 101 is disposed directly to the rear face of the n-type SiC substrate 91. Reference 98 shows an isolation region where acceptor ions are implanted for relaxing concentration of an electric field in the collector layer 92 to a second mesa structure 107 comprising the base layer 93 and the collector layer 92, reference 96 shows a surface passivation layer and 102 shows an upper layer electrode. A typical example of an existent power bipolar transistor structure for power application is shown in Solid-State Electronics vol. 46 pp. 567-572 (2002).

Further, an example of an arrangement for a drift layer, a gate layer and an anode layer in an existent power thyristor using SiC as a semiconductor material is as shown in FIG. 4. FIG. 4 as a typical example is a vertical cross sectional structural view of a device. On an n-type substrate 111, a drift layer 112 having an acceptor density of about $2 \times 10^{14}$ cm$^{-3}$, a gate layer 113 having a donor density of about $2 \times 10^{17}$ cm$^{-3}$ and an anode layer 115 having an acceptor density of about $1 \times 10^{19}$ cm$^{-3}$ are epitaxially grown. In the stack, a mesa structure 123 having the anode layer 115 and the gate layer 113 is formed. Then, a gate electrode 120 is formed by way of a gate contact region 117 where high doped donor is generated by ion implantation and activation annealing. Further, an anode electrode 119 is disposed directly to the anode layer 115, and a cathode electrode 121 is disposed directly to the rear face of the n-type SiC substrate 111. Reference 118 shows an isolation region where donor ions are implanted for relaxing concentration of an electric field in the drift layer 112 to a second mesa structure 127 having the gate layer 113 and the drift layer 112, and 116 shows a surface passivation layer and 122 shows an upper layer electrode. A typical example of existent power thyristor structure is shown in U.S. Pat. No. 5,539,217.

Further, as an improved proposal, a method of forming a semiconductor region for suppressing recombination near the surface of the low doped emitter layer is shown in JP-A-2006-351621. The technique is to be described more specifically with relation to a subject to be solved by the present invention.

SUMMARY OF THE INVENTION

In the examples shown in FIG. 3 and FIG. 4, since no appropriate wet etching solution is available for SiC used as the semiconductor material, dry etching has to be used for forming the mesa structures 103 and 123. At the interface between the surface of the layer 93 and the layer 113 exposed by dry etching and the surface passivation layers 96 or 116 such as SiO$_2$, recombination centers at high density (104 or 124 depicted by x in FIG. 3 or FIG. 4) remain even after by way of heat treatment step in other step such as activation annealing to ion implantation and activation annealing to the electrode after dry etching. Accordingly, among electrons injected from the emitter layer 95 to the base layer 93 or holes injected from the anode layer 115 to the gate layer 113, the ratio of those diffusing laterally, recombined at the recombination centers 104 or 124, and eliminated is not negligible. As a result, in a bipolar transistor, emitter size dependence of the current gain occurs, and a problem that the current gain of 35 required for practical use cannot be ensured arises when the emitter is made finer to less than existent 12 μm or so. Further, in the thyristor, since the gate current upon turn-on is large, and the turn-on loss reaches a not negligible level to DC loss when switching frequency is increased to 1 kHz or higher, improvement of the switching frequency is difficult.

As the countermeasure, for the problems described above, the following method is shown in JP-A No. 2006-351621 with an aim of decreasing recombination at the emitter mesa surface of the bipolar transistor. That is, as shown in FIG. 5, a low-doped emitter layer 94 is interposed between the existent emitter 95 and the base layer 93, the low-doped emitter 94 is exposed in the step of forming the emitter mesa 103, and a semiconductor region 105 for suppressing recombination is formed near the surface of the low-doped emitter layer 94 exposed by using ion implantation. When the method is applied also to the thyristor, a structure shown in FIG. 6 may be considered. That is, a low doped anode layer 114 is interposed between the existent anode layer 115 and the gate layer 113, the low-doped anode layer 114 is exposed in the step of forming the anode mesa 123, and a semiconductor region 125 for suppressing recombination is formed near the surface of the low-doped anode layer 114 exposed by using ion implantation.

By the improving method as described above, the effect of recombination at the interface of the surface passivation layer due to dry etching damage as the existent problem is decreased. However, since bulk recombination centers are introduced by ion implantation as shown by symbols x in the semiconductor region 105 or 125 for suppressing recombination in FIG. 5 or FIG. 6, the emitter size dependence of the current gain still occurs in the bipolar transistor. Accordingly, when the emitter is refined from about 10 μm, there is a problem that a required current gain 35 for practical use cannot be ensured. Further, in the thyristor, since the turn-on gate current is large and the turn-on loss is at an inneggligible level to the DC loss when the switching frequency is increased to 1 kHz or higher, improvement of the switching frequency is difficult.

The present invention has been accomplished in order to solve the problems described above and it intends at first to provide a bipolar transistor capable of ensuring a practically sufficient current gain and suitable for reduction in the size.

Secondly, the invention intends to provide a thyristor capable of high frequency switching at a low turn-on loss.

Thirdly, the invention intends to provide a bipolar transistor for power application having an extremely high current gain in which a power dissipation in a base drive circuit is decreased to a negligible level.

Fourthly, the present invention intends to provide a fabrication method of a bipolar transistor and a thyristor having the features described above.

In accordance with the first aspect of the invention, the first subject described above is attained by a bipolar transistor in which a semiconductor region for suppressing recombination is formed of an identical semiconductor having a donor density identical with that of a low-doped emitter layer, and is provided in contact with the base layer and the surface passivation layer, and the width of the semiconductor region for suppressing recombination is made equal with or longer than the electron diffusion length in the base layer. The bipolar transistor is suitable for power application use.

The semiconductor region for suppressing recombination means herein a semiconductor region for suppressing carrier recombination, which is identical here and hereinafter.

According to the second aspect of the invention, the second subject is attained by a thyristor in which the semiconductor region for suppressing recombination is formed of an identical semiconductor having an acceptor density identical with that of a low-doped anode layer and is provided in contact with a gate layer and a surface passivation layer, and the width of the semiconductor region for suppressing recombination is made equal with or longer than the hole diffusion length in the gate layer. The thyristor is suitable as power application.

Further, according to the third aspect of the invention, the third subject is attained by a bipolar transistor in which a hole barrier layer and an emitter contact layer, or a hole barrier layer, a conduction band discontinuity relaxed layer, and an emitter contact layer are stacked successively above a high-doped emitter layer above the low-doped emitter layer.

The hole barrier layer means herein a semiconductor layer forming such a band structure that constitutes a barrier for hole transport at the interface between two semiconductor layers. Further, the conduction band discontinuity relaxed layer means a semiconductor layer for relaxing the discontinuity amount in the conduction band at the interface between the two semiconductor layers. These are identical hereinafter.

Further, according to the invention, the fourth subject is attained by adopting the following steps. That is, this is a fabrication method including (a) a step of successively stacking, above an n-type semiconductor substrate, a base layer comprising a p-type semiconductor or a gate layer comprising an n-type semiconductor, a first emitter layer comprising an n-type semiconductor or a first gate layer comprising a p-type semiconductor, and a second emitter layer comprising an n-type semiconductor with the donor density being higher compared with the first emitter layer or a second anode layer comprising a p-type semiconductor with the acceptor density being higher compared with the first anode layer, (b) a step of partially etching a portion of the second emitter layer or the second anode layer and a portion of the first emitter layer or the portion of the first anode layer thereby forming an emitter region or an anode region, (c) a step of forming a base contact region or an anode contact region electrically connected with the base layer or the gate layer by way of the first emitter layer or the first anode region, each of which is exposed by the etching, (d) a step of forming each electrode of an emitter, a base, and a collector or each electrode of an anode, a gate, and a cathode, and (e) a step of forming a surface passivation layer in contact with the first emitter layer or the first anode layer, each of which is exposed by the etching.

According to the invention, reduction in the size and increased in the frequency can be attained in the bipolar device. Further, the structure can be attained at good reproducibility and controllability.

That is, the invention can at first provide a bipolar transistor capable of ensuring a practically sufficient current gain and suitable for size-reduction.

Secondly, the invention can provide a thyristor capable of high frequency switching at a low turn-on loss.

Thirdly, the invention can provide a bipolar transistor having an extremely high current gain in which the power dissipation in the base drive circuit is decreased to a not negligible level.

Fourthly, the invention can provide a fabrication method of a bipolar transistor and a thyristor having the features described above.

Any of the bipolar devices described above is extremely useful for power application use.

DETAILED DESCRIPTION OF THE PREFERRED EMBODIMENTS

Prior to illustration of specific embodiments, effects obtained by various devices of the invention are to be described generally with reference of FIG. 1, FIG. 3, FIG. 5, FIG. 22, FIG. 28, FIG. 29, and FIG. 30. While the description is to be made to a bipolar transistor as an example, the effect is quite identical also for the thyristor as a bipolar device excepting that the conduction type is reversed.

Figure 1:
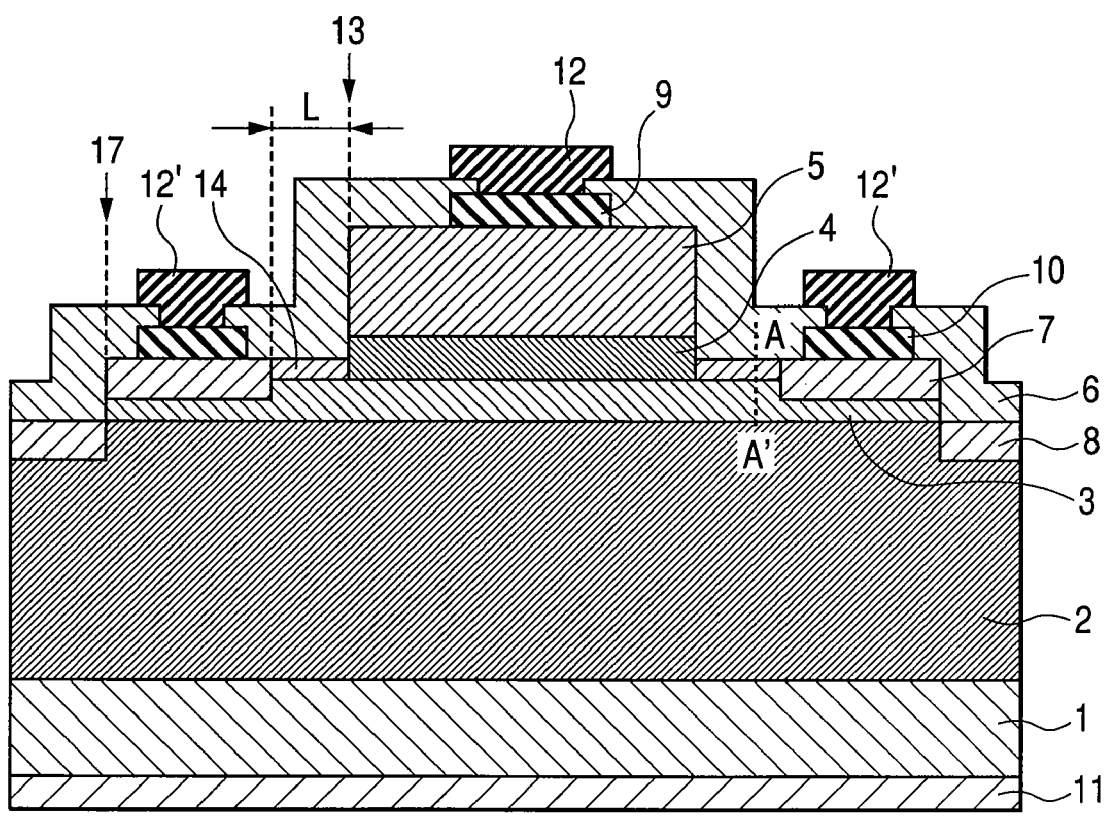
FIG. 1 is a vertical cross sectional structural view showing a first embodiment of the invention.

FIG. 1 is a vertical cross sectional view of a bipolar transistor for attaining the first subject. For example, above an n-type SiC substrate, a collector layer 2 comprising an n-type SiC, a base layer 3 comprising a p-type SiC, a first emitter layer 4 comprising a low-doped n-type SiC, and a second emitter layer 5 comprising a high-doped n-type SiC are provided being stacked, and a mesa structure 13 is formed with the second emitter layer 5, the first emitter layer 4 and the base layer 3. Further, ohmic electrodes are formed such the emitter electrode 9 is formed directly to the second emitter layer 5, the collector electrode 11 is formed directly to the rear face of the n-type SiC substrate 1, and the base electrode 10 is formed by way of the base contact region 7 formed by Al ion implantation. References 12 and 12' show upper layer electrodes. Reference 17 shows another mesa portion. More specific examples for the structure are to be described specifically in preferred embodiments.

Figure 3:
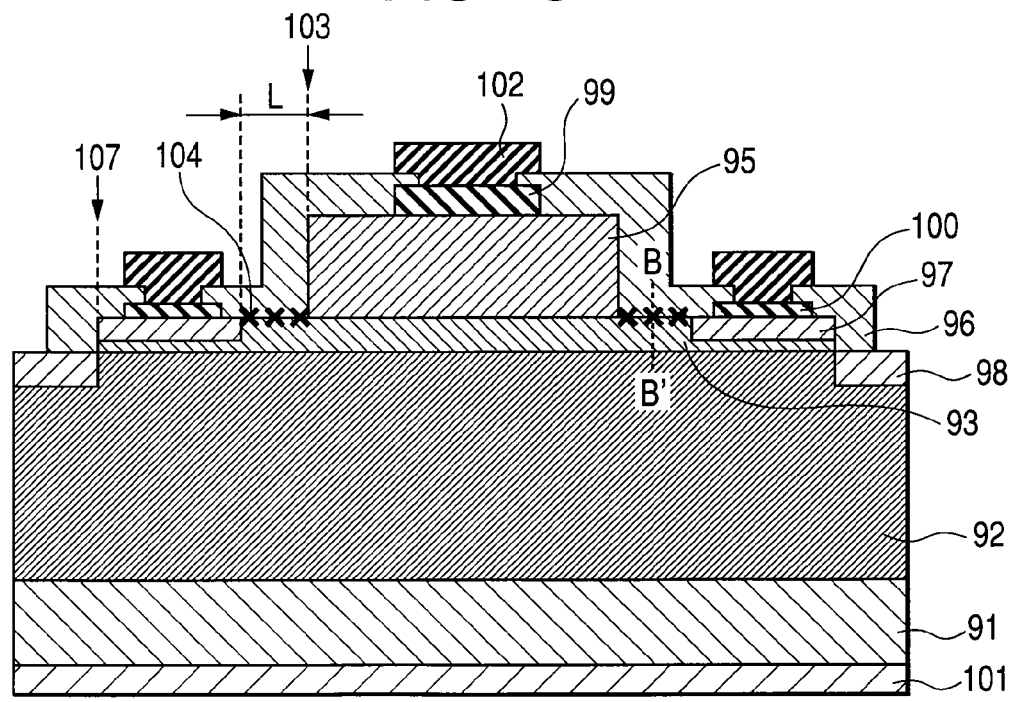
FIG. 3 is a vertical cross sectional structural view showing an existent technique.
Figure 4:
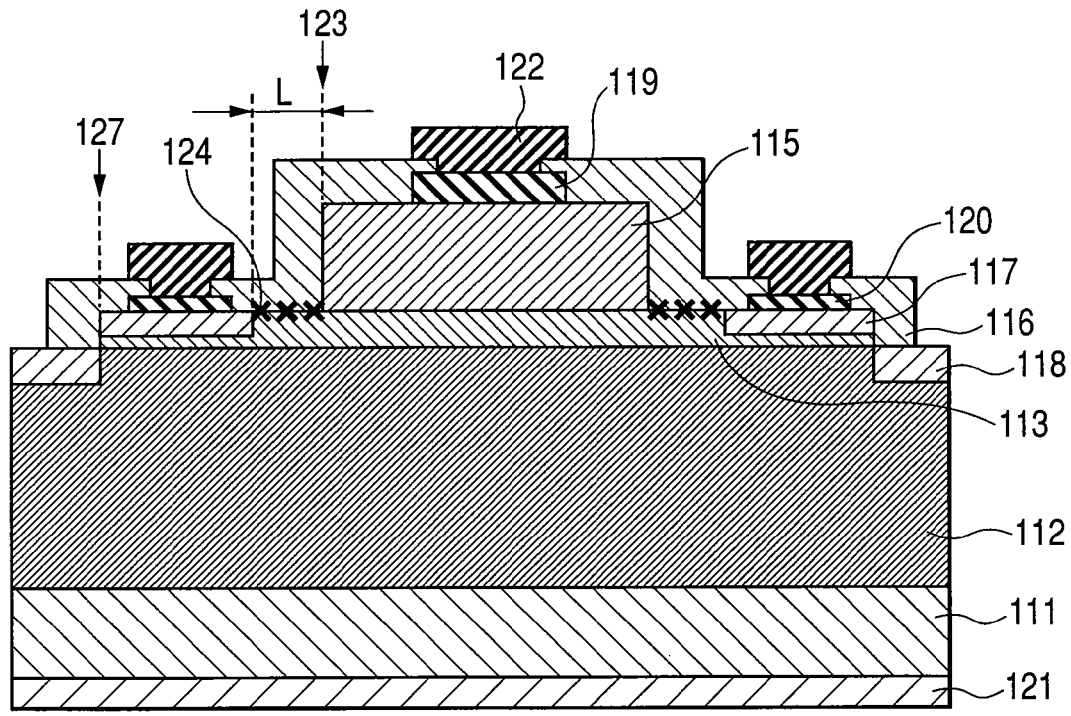
FIG. 4 is a vertical cross sectional structural view showing an existent technique.
Figure 5:
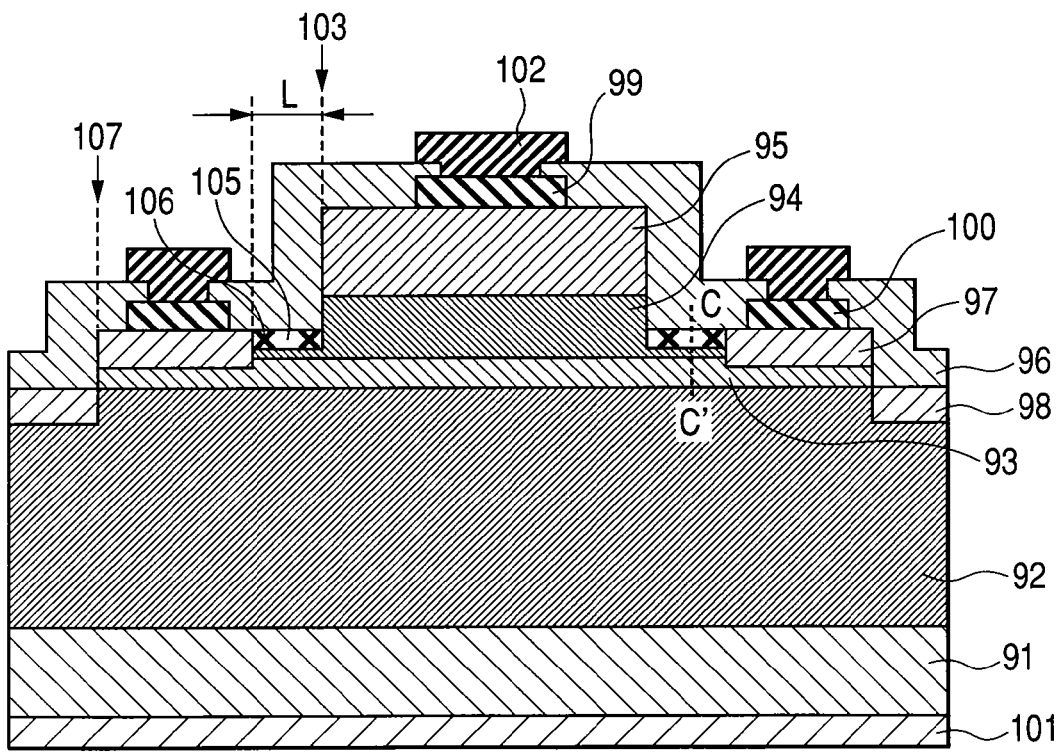
FIG. 5 is a vertical cross sectional structural view showing an improved existent technique.
Figure 6:
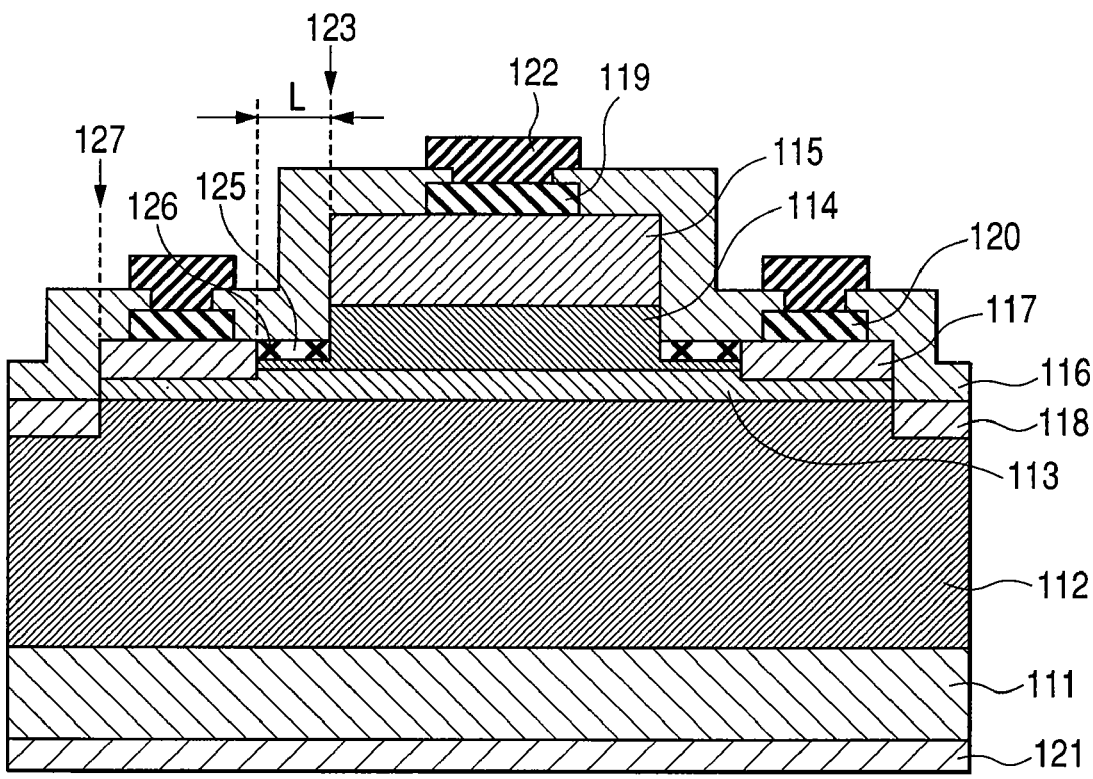
FIG. 6 is a vertical cross sectional structural view showing an improved existent technique.

On the other hand, FIG. 3 is a vertical cross sectional structural view of a bipolar transistor according to the existent technique, and FIG. 5 is a vertical cross sectional structural view of a bipolar transistor according to an improved proposal in the existent technique.

Figure 28:
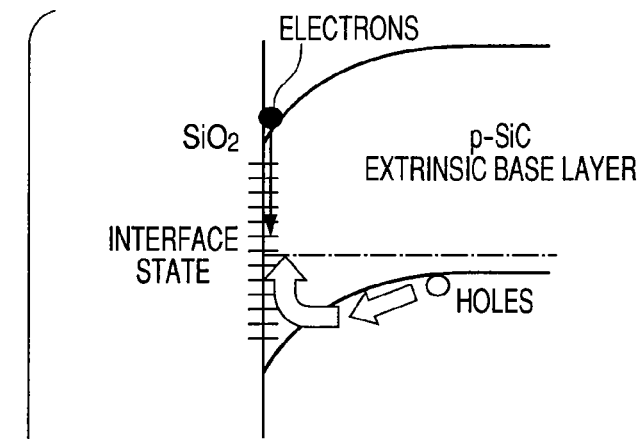
FIG. 28 is a schematic band diagram at B-B' section in FIG. 3, C-C' section in FIG. 5, and A-A' section in FIG. 1.
Figure 28:
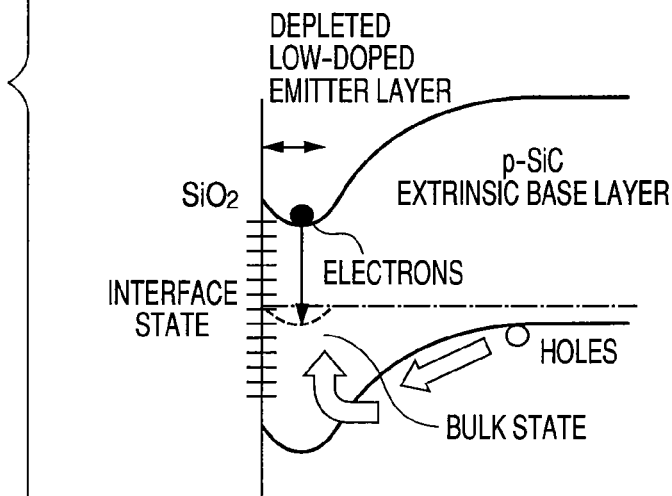
Figure 28:
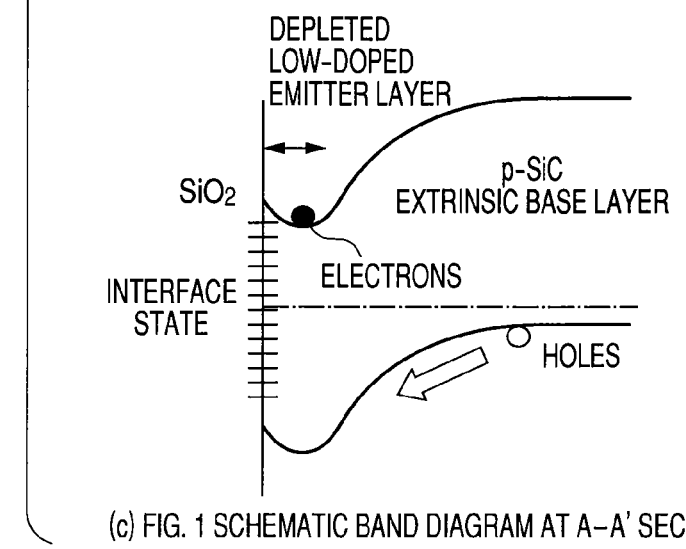

FIG. 28 is a schematic band diagram in which FIG. 28A is that along cross-section B-B' in FIG. 3, FIG. 28B is along C-C' in FIG. 5, and FIG. 28C is along cross-section A-A' in FIG. 1. That is, FIG. 28A shows an existent technique, FIG. 28B shows an improved existent proposal and FIG. 28C shows the invention, each of which is a band structural diagram at the interface between an $SiO_2$ film and an intrinsic base layer (p-SiC layer).

In the case of the existent technique shown in FIG. 3 and FIG. 28A, since recombination centers at high density are present at the interface between the surface of the layer 93 exposed by dry etching and the surface passivation film 96 such as of $SiO_2$, the following phenomenon occurs. That is, electrons injected from the emitter to the base diffuse laterally, and when they are captured at the interface recombination centers (shown as interface state in the drawing), holes as major carriers in the base layer are recombined there. As a result, the ratio of major carriers, among the electrons injected from the emitter layer to the base layer, eliminated by interface recombination is not negligible.

In the improved proposal shown in FIG. 5 and FIG. 28C, while the depleted semiconductor region for suppressing recombination suppresses interface recombination which is the problem of the existent technique, since the bulk recombination centers (shown as bulk state in the drawing) are present in the semiconductor region for suppressing recombination, the ratio of the major carriers that are eliminated by bulk recombination is not negligible. That is, when electrons injected from the emitter to the base diffuse laterally and are captured at the bulk interface recombination centers, holes as the major carrier in the base layer are recombined there. As a result, among the electrons injected from the emitter layer to the base layer, the ratio of those eliminated by the bulk recombination is not negligible.

On the contrary, in the invention shown in FIG. 1 and FIG. 28C, the depleted semiconductor region for suppressing recombination suppresses the interface combination which is the problem in the existent technique, and bulk recombination centers due to ion implantation are not present also in the semiconductor region for suppressing recombination. Accordingly, even when the electrons injected from the emitter to the base diffuse laterally, the ratio that they are recombined with holes as the major carrier can be improved to a negligible level in the SiC base layer as the indirect transition semiconductor. Accordingly, the structure of the invention provides an effect of maintaining the current gain of about 35 which is required for practical use even when the emitter size is decreased.

Figure 22:
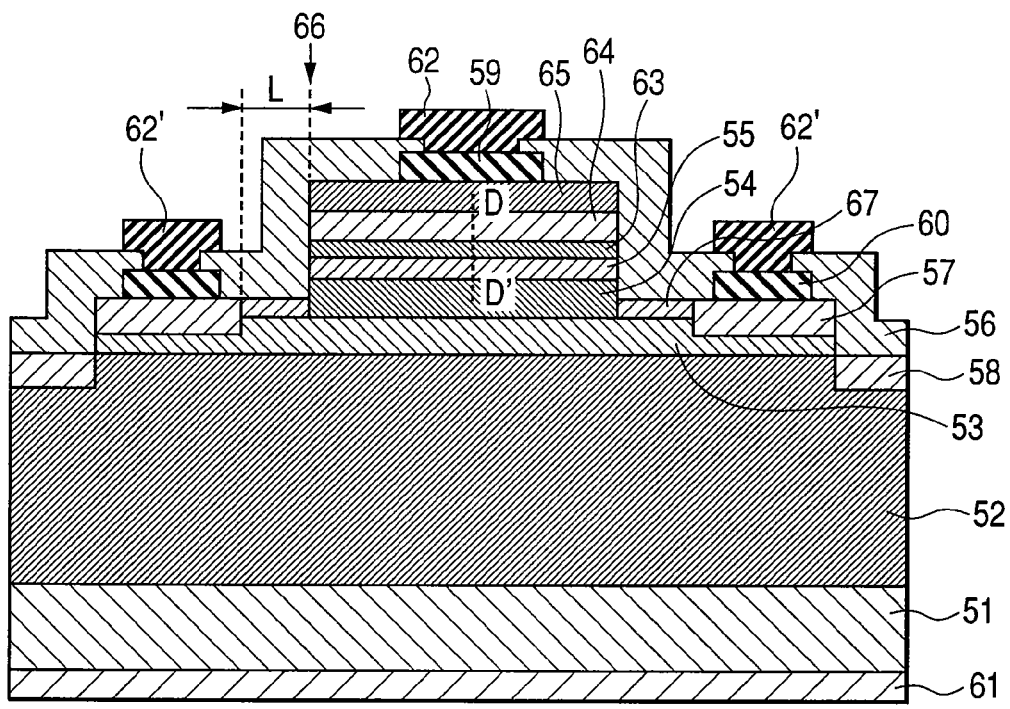
FIG. 22 is a vertical cross sectional structural view showing a third embodiment of the invention.
Figure 29:
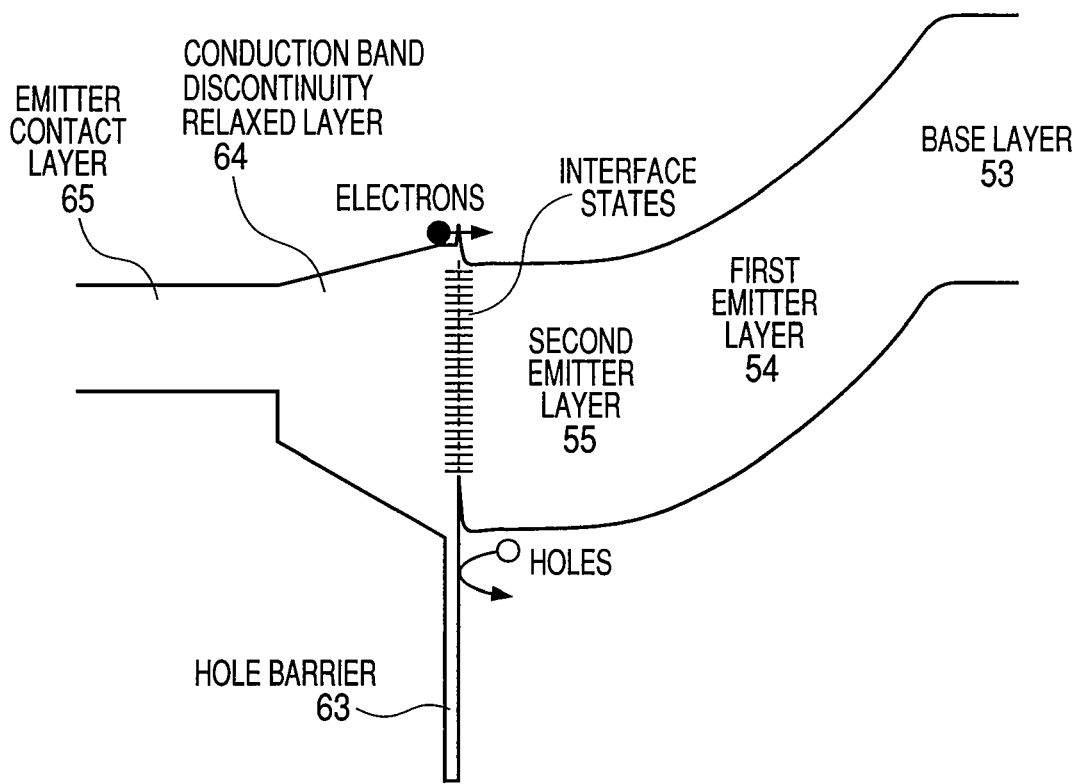
FIG. 29 is a schematic band diagram near emitter-base junction in the third embodiment of the invention.

Further, to improve the current gain to about 100 or more, it is necessary to suppress the number of holes injected from the base layer to the emitter layer while suppressing the emitter size dependence of the current gain. FIG. 22 is a vertical cross sectional structural view of a bipolar transistor having such an effect and FIG. 29 is a schematic band diagram at cross section D-D' in FIG. 22. Different from FIG. 1, the thickness of the second emitter layer 55 in FIG. 22 is reduced to equal to or less than the diffusion length of the hole, and a hole barrier layer 63, a conduction band discontinuity relaxed layer 64, and an emitter contact layer 65 are provided above the emitter layer 55.

A specific structural example of an npn-type SiC bipolar transistor shown in FIG. 22 is as described below. Above an n-type SiC substrate (0001) Si surface 51, a collector layer 52 comprising an n-type SiC, a base layer 53 comprising a p-type SiC, a first emitter layer 54 comprising an n-type SiC, a second emitter layer 55 comprising an n-type SiC, a hole barrier layer 63 comprising $HfO_2$, a conduction band discontinuity relaxed layer 64 comprising amorphous SiN, and an emitter contact layer 65 comprising polycrystal Si are formed. Then, a mesa structure 66 is formed with the emitter contact layer 65, the conduction band discontinuity relaxed layer 64, the hole barrier layer 63, the second emitter layer 65, the first emitter layer 64, and the base layer 63. Further, as the ohmic electrodes, the emitter electrode 59 is formed directly to the emitter contact layer 65, the collector electrode 61 is formed directly to the rear face of the n-type SiC substrate 51 and the base electrode 60 is formed by way of the base contact region 57 formed by Al ion implantation. More specific examples of this structure is to be illustrated in the embodiments to be described later.

Figure 30:
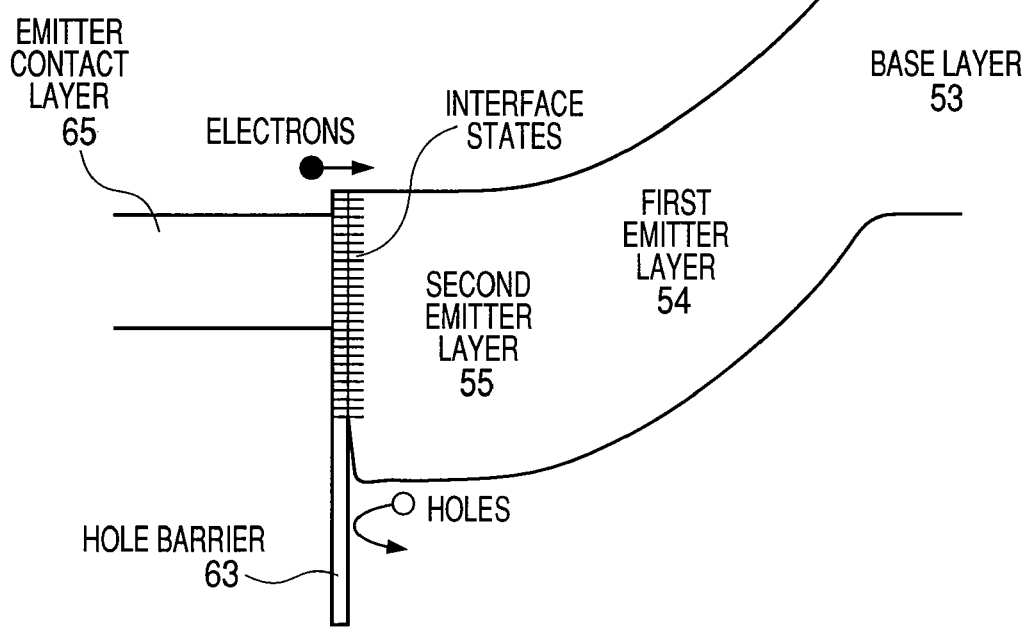
FIG. 30 is a schematic band diagram near emitter-base junction in the fifth embodiment of the invention.

When a hole barrier layer 63 of a small amount of conduction band discontinuity is adopted between the second emitter layer 55 and the emitter contact layer 65, the conduction band discontinuity relaxed layer 64 may not be used as shown in the band structural diagram in FIG. 30. In any of FIG. 29 and FIG. 30, while holes injected from the base layer 53 to the first emitter layer 54 diffuse as far as the second emitter layer 54, they cannot intrude as far as the emitter contact layer 65 by the hole barrier 63 with a large amount of valence electron band discontinuity. As a result, the emitter efficiency defined by the ratio of the electron current in the emitter current can be increased to provide an effect of attaining about 100 or more of the current gain which was difficult to be attained by the existent bipolar transistor using SiC homojunction.

The outline of the present invention has been described above, and main embodiments of the invention are to be set forth below.

(1) A bipolar transistor includes: a base layer comprising a p-type semiconductor; a first emitter layer comprising an n-type semiconductor; and a second emitter layer comprising an n-type semiconductor with a donor density being higher compared with that of the first emitter layer are stacked successively. The bipolar transistor has a portion of the first emitter layer, the second emitter layer, and a surface passivation layer in a mesa structure, and has a base-contact region disposed to the periphery of the second emitter layer sandwiching a semiconductor region for suppressing recombination and connected electrically with the base layer. The semiconductor region for suppressing recombination comprises an identical semiconductor having a donor density identical with that of the first emitter layer and is present in contact with the base layer and the surface passivation layer, and the width of the semiconductor region for suppressing recombination is equal with or longer than the electron diffusion distance in the base layer.

(2) A thyristor includes: a gate layer comprising an n-type semiconductor; a first anode layer comprising a p-type semiconductor; and a second anode layer comprising a p-type semiconductor with an acceptor density being higher compared with that of the first anode layer are stacked successively. The thyristor has a portion of the first anode layer, the second anode layer, and a surface passivation layer in a mesa structure, and has a gate-contact region disposed to the periphery of the second anode layer sandwiching a semiconductor region for suppressing recombination and connected electrically with the gate layer. The semiconductor region for suppressing recombination comprises an identical semiconductor having an acceptor density identical with that of the first anode layer and is present in contact with the gate layer and the surface passivation layer, and the width of the semiconductor region for suppressing recombination is equal with or longer than the hole diffusion distance in the gate layer.

(3) The bipolar transistor according to (1), wherein a hole barrier layer and an emitter contact layer are further stacked successively above the second emitter layer.

(4) The bipolar transistor according to (1), wherein a hole barrier layer, a conduction band discontinuity relaxed layer, and an emitter contact layer are further stacked successively above the second emitter layer.

(5) The bipolar transistor according to (1), (3), or (4), wherein each of the base layer, the first emitter layer, and the second emitter layer comprises SiC.

(6) The thyristor according to (2) above, wherein each of the gate layer, the first anode layer, and the second anode layer comprises SiC.

(7) The bipolar transistor according to (3) to (5), wherein the emitter contact layer comprises polycrystal Si.

(8) The bipolar transistor according to (3), (4), (5) or (7), wherein the hole barrier layer comprises an AlGaN alloy.

(9) The bipolar transistor according to (3), (4), (5) or (7), wherein the hole barrier layer comprises $HfO_2$, or $HfO_2$ which is sandwiched at the opposing surfaces thereof with SiN.

(10) The bipolar transistor according to any one of (4), or (7) to (9), wherein the conduction band discontinuity relaxed layer comprises SiN.

(11) A fabrication method for a bipolar transistor including the steps of; successively stacking, above an n-type semiconductor substrate, a base layer comprising a p-type semiconductor, a first emitter layer comprising an n-type semiconductor, and a second emitter layer comprising an n-type semiconductor having a donor density being higher compared with that of the first emitter layer; partially etching a portion of the first emitter layer and the second emitter layer thereby forming an emitter region; forming a base contact region connected electrically with the base layer by way of the first emitter layer exposed by the etching; forming electrodes for emitter, base, and collector to the second emitter layer, the base contact region, and the n-type semiconductor substrate respectively; and forming a surface passivation layer in contact with the first emitter layer exposed by the etching.

(12) A fabrication method for a thyristor including the steps of; successively stacking, above an n-type semiconductor substrate, a gate layer comprising an n-type semiconductor, a first anode layer comprising a p-type semiconductor, and a second anode layer comprising a p-type semiconductor having an acceptor density being higher compared with that of the first anode layer; partially etching a portion of the first anode layer and the second anode layer thereby forming an anode region; forming a gate contact region connected electrically with the gate layer by way of the first anode layer exposed by the etching; forming electrodes for anode, gate, and cathode to the anode layer, the gate contact region, and the n-type semiconductor substrate, respectively; and forming a surface passivation layer in contact with the first anode layer exposed by the etching.

(13) A fabrication method for a bipolar transistor including the steps of: successively stacking, above an n-type semiconductor substrate, a base layer comprising a p-type semiconductor, a first emitter layer comprising an n-type semiconductor, a second emitter layer comprising an n-type semiconductor with a donor density being higher compared with that of the first emitter layer, a hole barrier layer, and an emitter contact layer; partially etching the emitter contact layer, the hole barrier layer, the second emitter layer, and a portion of the first emitter layer thereby forming an emitter region; forming a base contact region connected electrically with the base layer by way of the first emitter layer exposed by the etching; forming electrodes for emitter, base, and collector to the emitter contact layer, the base contact region, and the n-type semiconductor substrate, respectively; and forming the surface passivation layer in contact with the first emitter layer exposed by the etching.

(14) A fabrication method for a bipolar transistor including the steps of; successively stacking, above an n-type semiconductor substrate, a base layer comprising a p-type semiconductor, a first emitter layer comprising an n-type semiconductor, a second emitter layer comprising an n-type semiconductor having a donor density being higher compared with that of the first emitter layer, a hole barrier layer, a conduction band discontinuity relaxed band, and an emitter contact layer; partially etching the emitter contact layer, the conduction band discontinuity relaxed layer, the hole barrier layer, the second emitter layer, and a portion of the first emitter layer thereby forming an emitter region; forming a base contact region connected electrically with the base layer by way of the first emitter layer exposed by the etching; forming electrodes for emitter, base, and collector to the emitter contact layer, the base contact region, and the n-type semiconductor substrate, respectively; and forming the surface passivation layer in contact with the first emitter layer exposed by the etching.

In the present specification, description is to be made to SiC as an example but it will be apparent from the descriptions regarding the function and effect of the invention described above that the invention is applicable to a bipolar device involving the problem of surface recombination.

Then, the bipolar device of the invention and fabrication steps thereof are to be described specifically.

Embodiment 1

An npn type SiC bipolar transistor as a first embodiment of the invention and fabrication steps thereof are to be described with reference to FIG. 1, FIG. 7 to FIG. 11, and FIG. 23.

Figure 23:
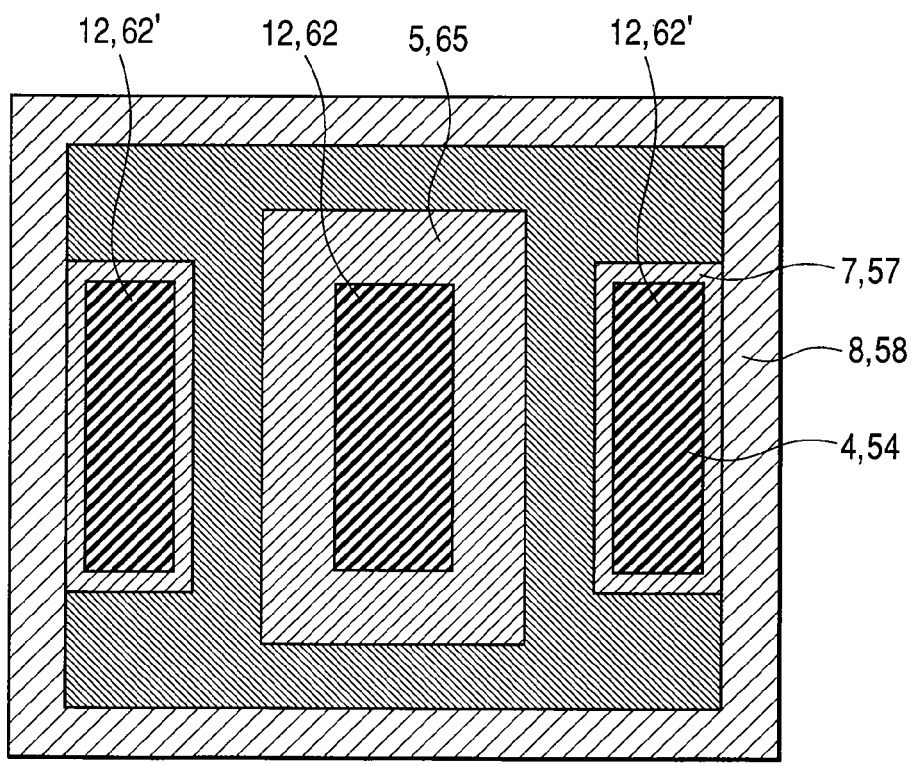
FIG. 23 is a plan view showing a first, third, fourth, and fifth embodiments of the invention.

FIG. 1 is a vertical cross sectional structural view of an npn-type SiC bipolar transistor as a first embodiment of the invention, and FIG. 23 is a plan view thereof. Reference numerals are used in common with both of the drawings. Above an n-type SiC substrate 1 ((0001) Si surface, donor (N) density of $3\times10^{18}$ cm$^{-3}$), a collector layer 2 comprising an n-type SiC (15 μm thickness, donor (N) density: $2\times10^{16}$ cm$^{-3}$), a base layer 3 comprising a p-type SiC (1 μm thickness, acceptor (Al) density: $2\times10^{17}$ cm$^{-3}$), a first emitter layer 4 comprising an n-type SiC (100 nm thickness, donor (N) density: $3\times10^{17}$ cm$^{-3}$), and a second emitter layer 5 comprising an n-type SiC (1 μm thickness, donor (N) density: $1\times10^{19}$ cm$^{-3}$). Then, the second emitter layer 5, the first emitter layer 4 and the base layer 3 form a mesa structure 13. Further, as ohmic electrodes, an emitter electrode (Ni/Ti) 9 is formed directly to the second emitter layer 5, a collector electrode (Ni/Ti) 11 is formed directly to the rear face of the n-type SiC substrate 1, and the base electrode (Ti/Al) 10 is formed by way of a base contact region (average Al concentration: $1\times10^{19}$ cm$^{-3}$) 7 formed by Al ion implantation.

Then, the first emitter layer 4 remains at a thickness of about 50 nm to the outside of the mesa structure 13, and is present being depleted as a semiconductor region 14 for suppressing recombination. The semiconductor region 14 for suppressing recombination is in contact at the lower surface with the base layer 3 and in contact at the upper surface with the surface passivation layer 6, and has a distance L from the end of the mesa structure 13 to the base contact region. The distance L is equal with or longer than the electron diffusion length in the base layer 3 (3.2 μm, at electron mobility of 400 cm$^2$/Vs, life of about 10 ns in the case of this embodiment). When L is shorter than the electron diffusion length in the base layer 3, since electrons are captured at the bulk recombination centers present in the base contact region 7 and being attributable to ion implantation, the emitter size dependence of the current gain can no more be suppressed.

An example of fabrication steps for the npn-type SiC bipolar transistor shown in FIG. 1 (cross sectional view) and a FIG. 23 (plan view) with reference to vertical cross sectional structural views shown in FIG. 7 to FIG. 11.

Figure 7:
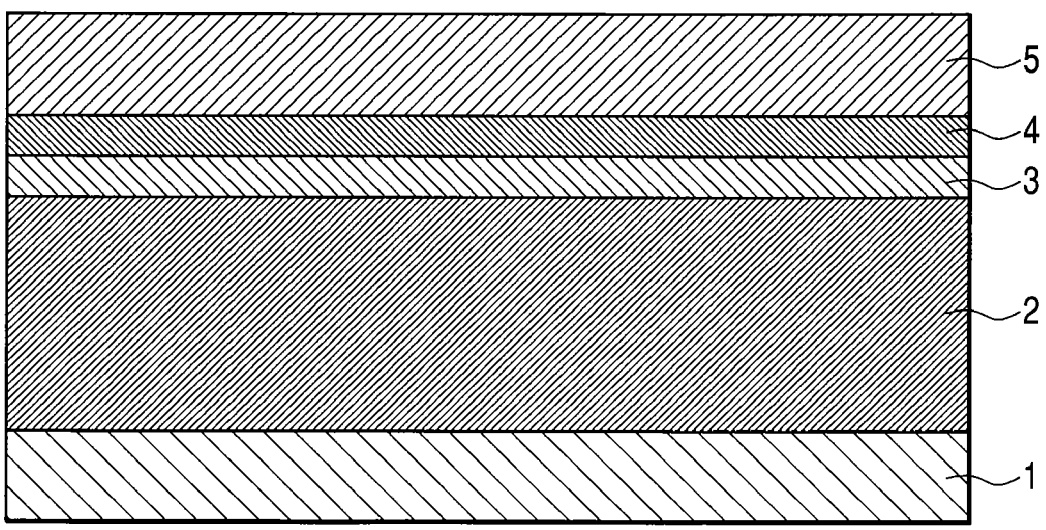
FIG. 7 is a vertical cross sectional structural view showing fabrication steps in a first embodiment of the invention.

At first, above the n-type SiC substrate 1, an n-type SiC collector layer 2, a p-type SiC base layer 3, an n-type Sic first emitter layer 4, and an n-type SiC second emitter layer 5 are epitaxially grown by chemical vapor deposition (FIG. 7).

Figure 8:
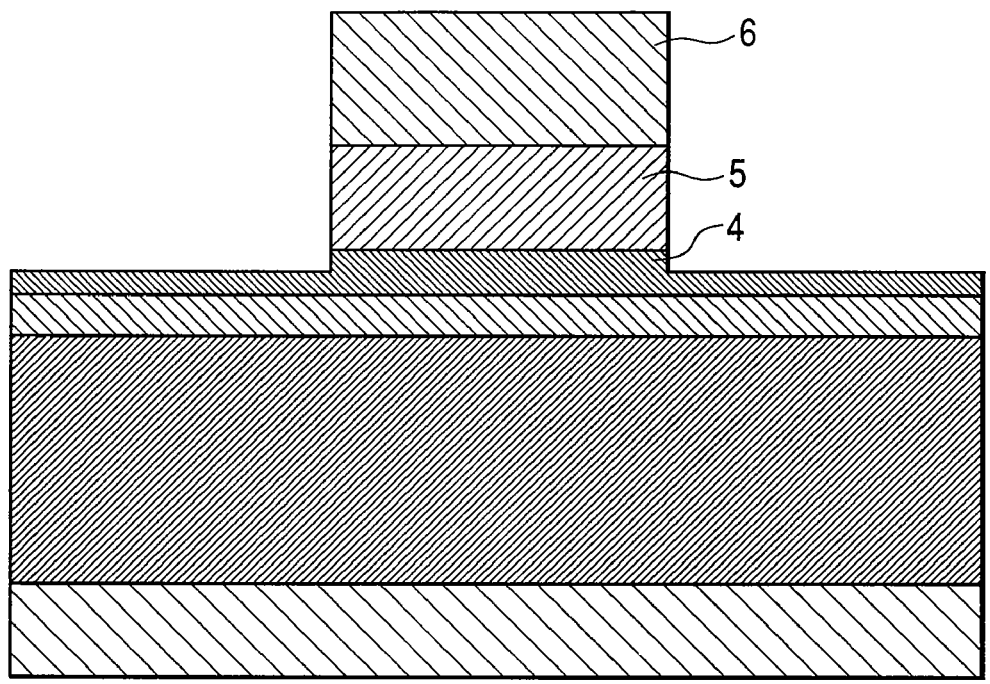
FIG. 8 is a vertical cross sectional structural view showing fabrication steps in the first embodiment of the invention.

Then, an SiO$_2$ film 6 is deposited and, after photolithography and SiO$_2$ dry etching, a photoresist is removed to form an SiO$_2$ pattern. Then, a portion for the n-type SiC first emitter layer 4 and the n-type SiC second emitter layer 5 is subjected to first mesa fabrication by dry etching (FIG. 8).

Figure 9:
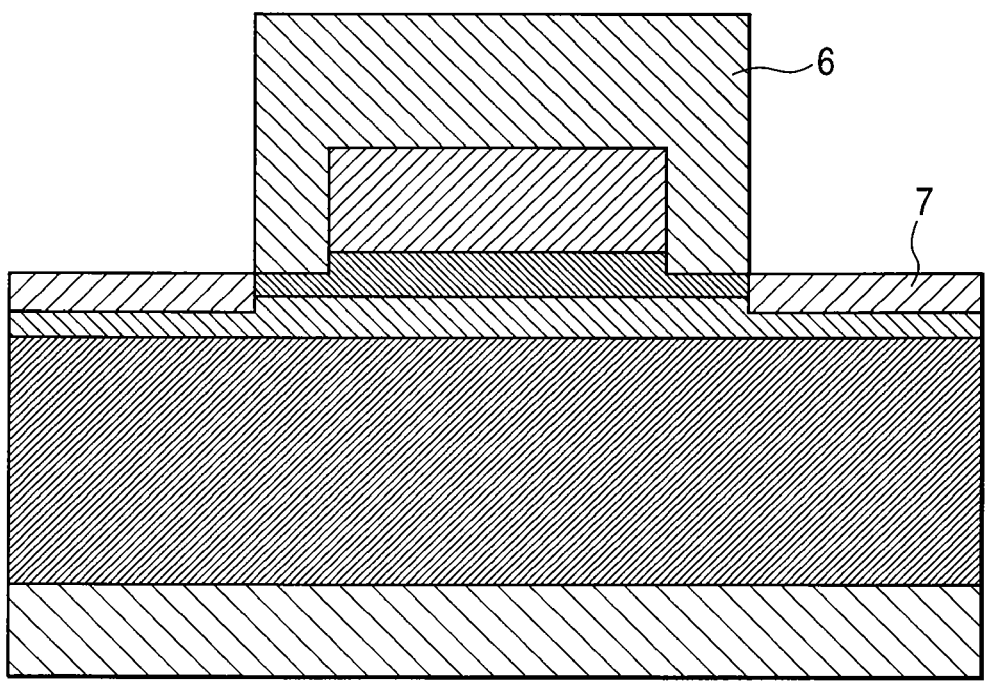
FIG. 9 is a vertical cross sectional structural view showing fabrication steps in the first embodiment of the invention.

Successively, the SiO$_2$ pattern is removed by hydrofluoric acid, the SiO$_2$ film 6 is deposited again, an SiO$_2$ pattern is formed by photolithography and SiO$_2$ dry etching and Al ion implantation is conducted to the base contact region 7 (FIG. 9).

Figure 10:
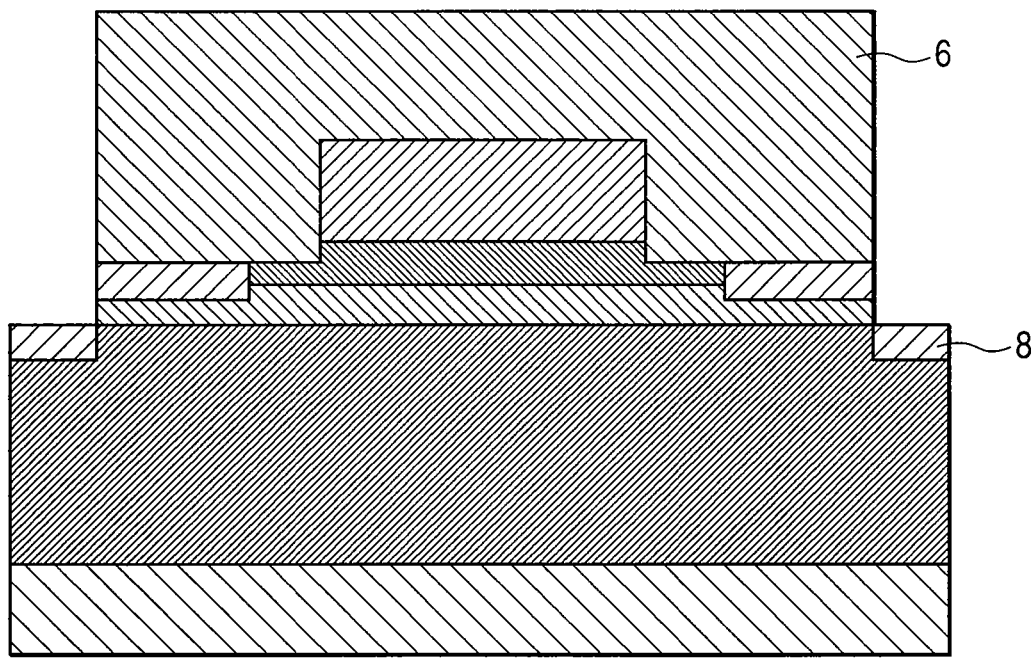
FIG. 10 is a vertical cross sectional structural view showing fabrication steps in the first embodiment of the invention.

Then, SiO$_2$ is removed by hydrofluoric acid, the SiO$_2$ film 6 is again deposited, photolithography and SiO$_2$ dry etching are conducted and a photoresist is removed thereby forming an SiO$_2$ pattern. Successively, a second mesa fabrication is conducted to the residue of the first emitter layer 4, and the base layer 3 and a portion of the collector layer 2 by dry etching, and ion implantation is conducted for an isolation region 8 with an aim of electric field relaxation (FIG. 10).

Figure 11:
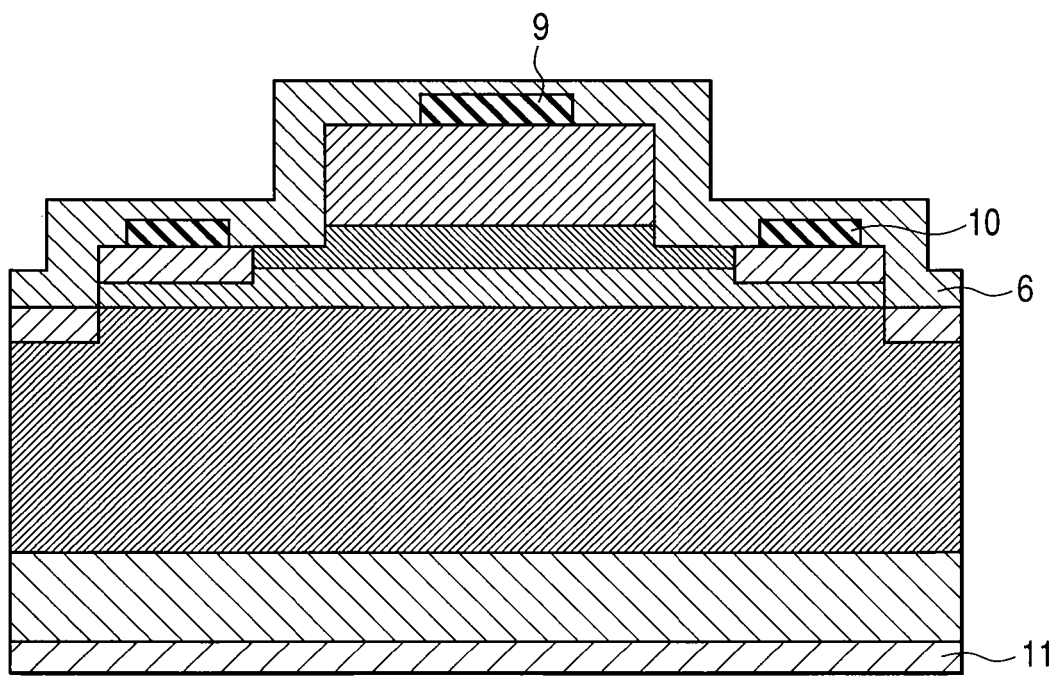
FIG. 11 is a vertical cross sectional structural view showing fabrication steps in a first embodiment of the invention.

Successively, after forming a collector electrode 11 at the rear face of the SiC substrate 1, the SiO$_2$ pattern is removed by hydrofluoric acid and an emitter electrode 9 and a base electrode 10 are formed by deposition and lift off, annealing is conducted at about 1500° C., and an SiO$_2$ film 6 is deposited on the surface (FIG. 11).

Finally, photolithography and SiO$_2$ dry etching were conducted and an Al upper layer electrode 12 is formed to fabricate a bipolar transistor (FIG. 1).

In the bipolar transistor fabricated in this embodiment, it can be confirmed that the current gain remained as it is at 35 without no reduction even when the emitter width is decreased from 12 μm in the existent case to about 6 μm.

According to this embodiment, even when electrons injected from the emitter to the base diffuse laterally, the ratio of them recombined to the interface recombination centers or bulk recombination centers is decreased to a negligible level. As a result, an SiC bipolar transistor balancing a practically sufficient current gain and size reduction can be attained.

Embodiment 2

An SiC thyristor and fabrication steps thereof as a second embodiment of the invention are to be described with reference to FIG. 2 and FIG. 12 to FIG. 16.

Figure 2:
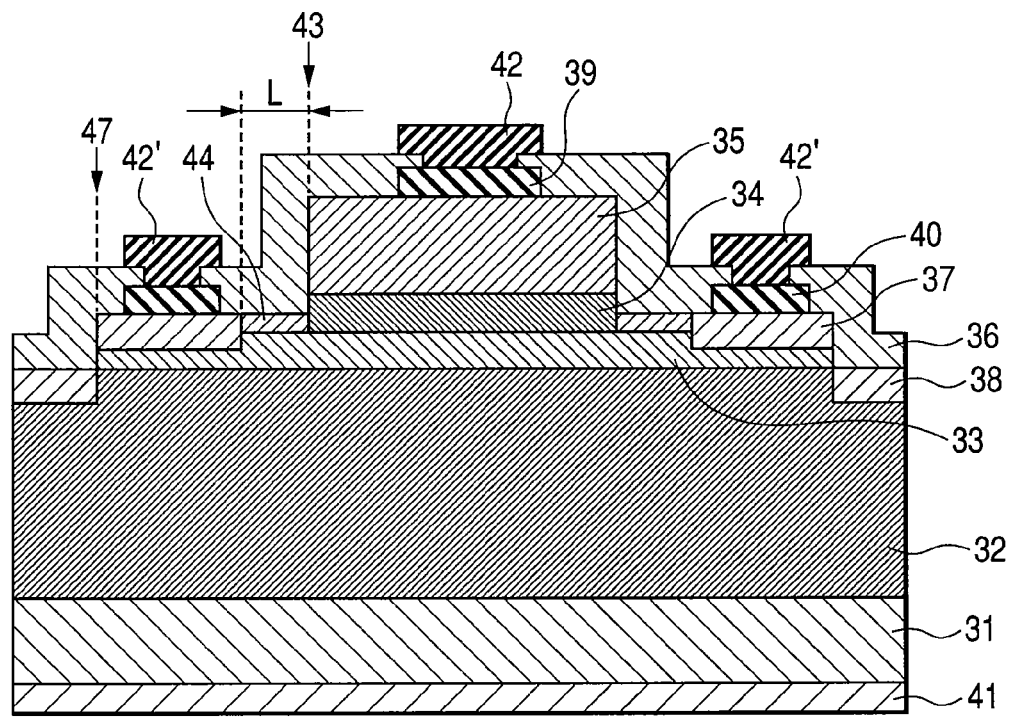
FIG. 2 is a vertical cross sectional structural view showing a first embodiment of the invention.

FIG. 2 is a vertical cross sectional vertical view of an SiC thyristor as a second embodiment of the invention. Above an n-type SiC substrate ((0001) Si surface, donor (N) density: $3\times10^{18}$ cm$^{-3}$) 31, a drift layer 32 comprising a p-type SiC (100 μm thickness, acceptor (Al) density; $2\times10^{14}$ cm$^{-3}$) layer, a gate layer 33 comprising an n-type SiC (1 μm thickness, donor (N) density: $2\times10^{17}$ cm$^{-3}$), a first anode layer 34 comprising a p-type SiC (100 nm thickness, acceptor (Al) density: $3\times10^{17}$ cm$^{-3}$), and a second anode layer 35 comprising a p-type SiC (1 μm thickness, acceptor (Al) density $1\times10^{19}$ cm$^{-3}$) are formed. Then, the second anode layer 35, the first anode layer 34, and the gate layer 33 form a mesa structure 43. Further, as the ohmic electrodes, an anode electrode (Ti/Al) 39 is formed directly to the second anode layer 35, a cathode electrode (Ti/Al) 41 is formed directly to the rear face of the n-type SiC substrate 1, and a gate electrode (Ni/Ti) 40 is formed by way of a gate contact region (average N concentration: $1\times10^{19}$ cm$^{-3}$) 37 formed by N ion implantation.

In this case, the first anode layer 34 remains at about 50 nm thickens to the outside of the mesa structure 43 and present being depleted as a semiconductor region 44 for suppressing recombination. The semiconductor region 44 for suppressing recombination is in contact at the lower surface with the gate layer 33 and in contact at the upper surface with the surface passivation layer 36, and has a distance L from the end of the mesa structure 43 to the gate contact region equal with or longer than the hole diffusion length in the gate layer 33 (1.1

μm, at an electron mobility of 500 cm²/Vs, and a life of about 10 ns in this embodiment). When L is shorter than the hole diffusion length in the gate layer 33, since holes are captured at bulk recombination centers present in the gate contact region 37 and attributable to ion implantation, turn-on loss is increased.

An example of fabrication steps for the SiC thyristor shown in FIG. 2 is to be described with reference to vertical cross sectional structural views shown in FIG. 12 to FIG. 16.

Figure 12:
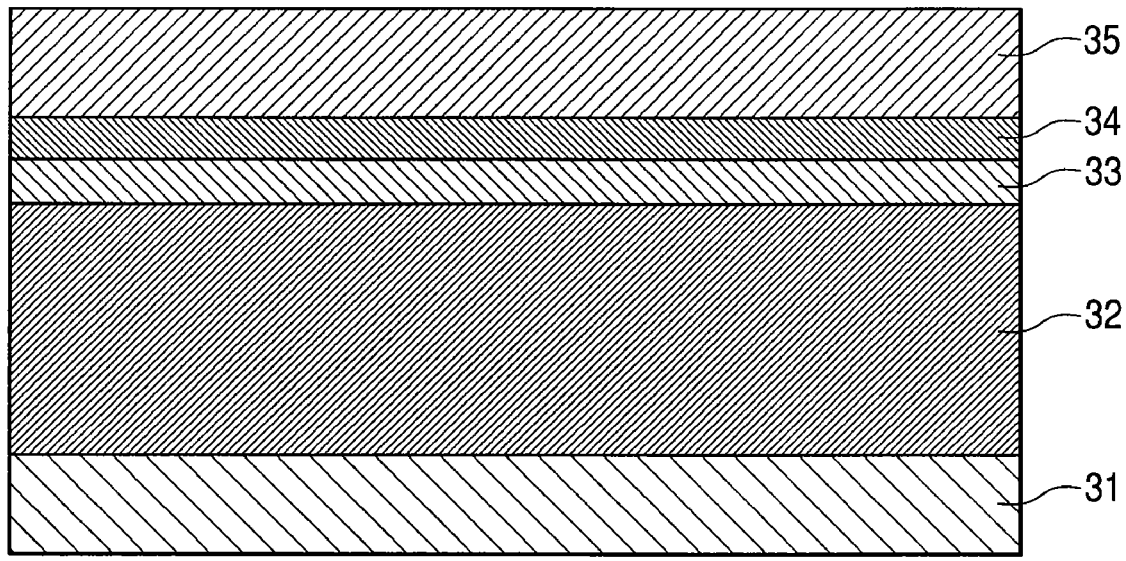
FIG. 12 is a vertical cross sectional structural view showing fabrication steps in a second embodiment of the invention.

At first, above an n-type type SiC substrate 31, a p-type SiC drift layer 32, an n-type SiC gate layer 33, a p-type SiC first anode layer 34, and a p-type SiC second anode layer 35 are epitaxially grown by chemical vapor deposition (FIG. 12).

Figure 13:
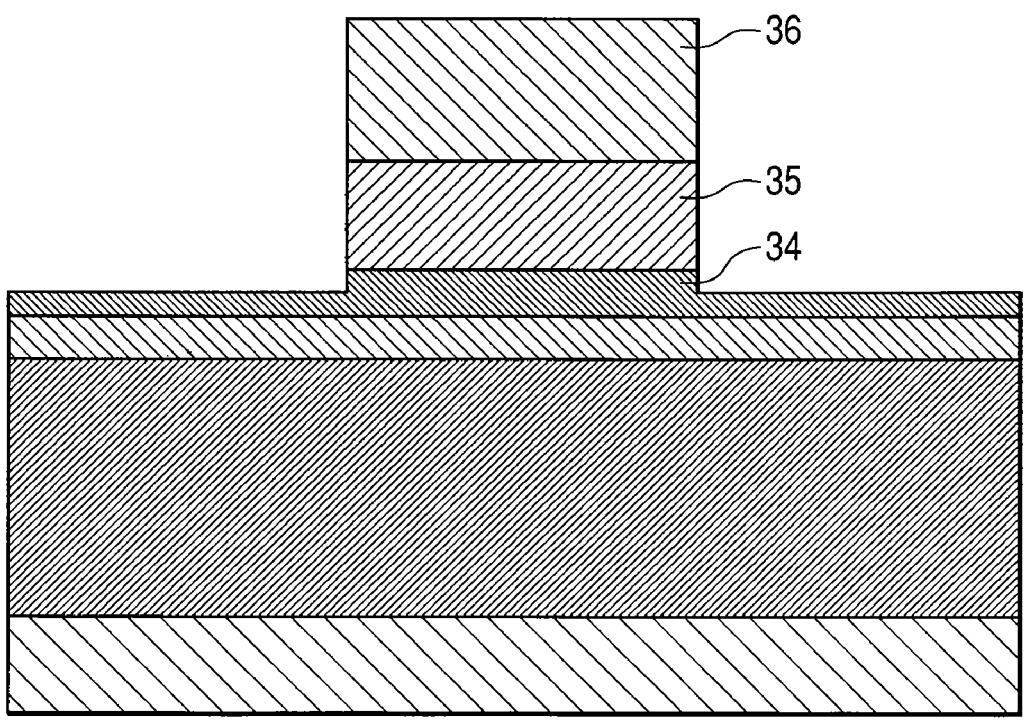
FIG. 13 is a vertical cross sectional structural view showing fabrication steps in a second embodiment of the invention.

Then, an SiO₂ film 36 is deposited and, after photolithography and SiO₂ dry etching, a photoresist is removed to form an SiO₂ pattern. Then, first mesa fabrication is conducted by dry etching for the p-type SiC second anode layer 35 and a portion of the p-type SiC first anode layer 34 (FIG. 13).

Figure 14:
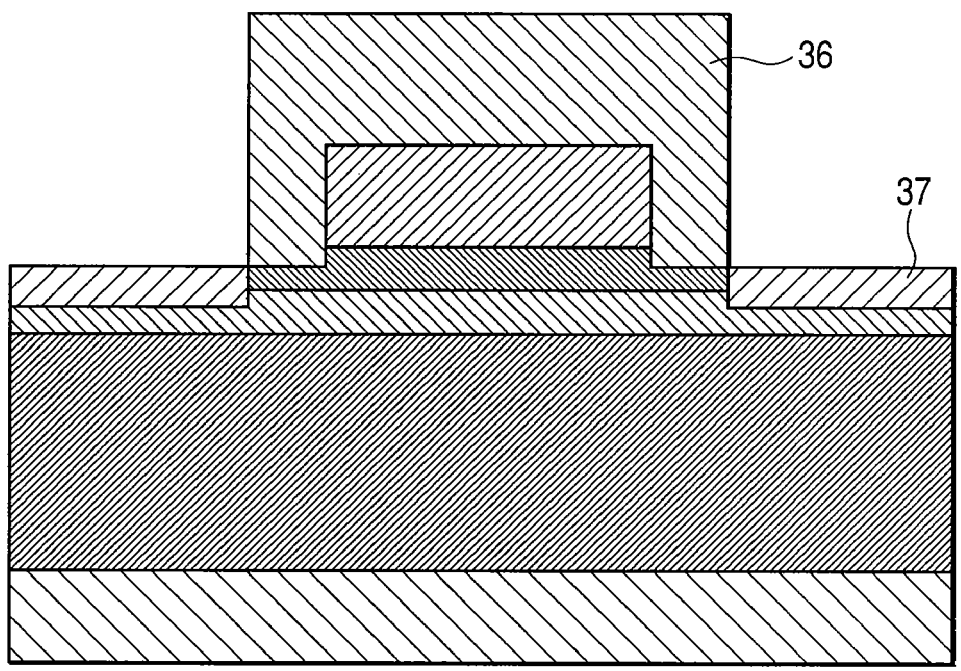
FIG. 14 is a vertical cross sectional structural view showing fabrication steps in a second embodiment of the invention.

Successively, the SiO₂ pattern was removed by hydrofluoric acid, the SiO₂ film 36 is deposited again and an SiO₂ pattern is formed by photolithography and SiO₂ dry etching, and N ions are implanted into a gate contact region 37 (FIG. 14).

Figure 15:
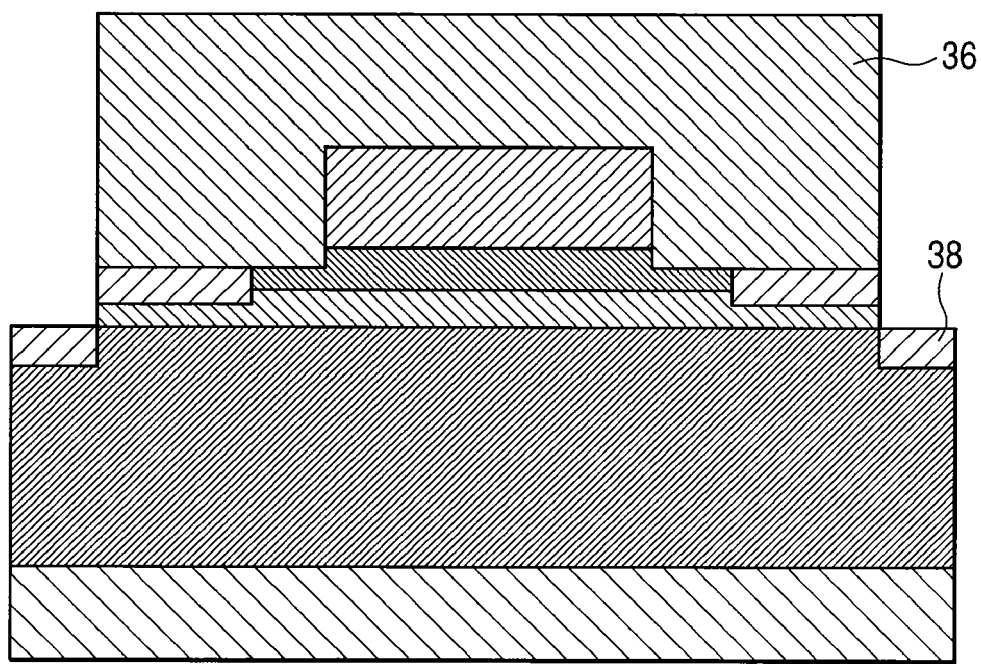
FIG. 15 is a vertical cross sectional structural view showing fabrication steps in a second embodiment of the invention.

Then, SiO₂ is removed by hydrofluoric acid, the SiO₂ film 36 is deposited again, photolithography and SiO₂ dry etching are conducted, and a photoresist is removed to form an SiO₂ pattern. Successively, second mesa fabrication is conducted by dry etching of the residue of the first anode layer 34, the gate layer 33 and a portion of the drift layer 32, and ion implantation for an isolation region 38 is conducted with an aim of electric field relaxation (FIG. 15).

Figure 16:
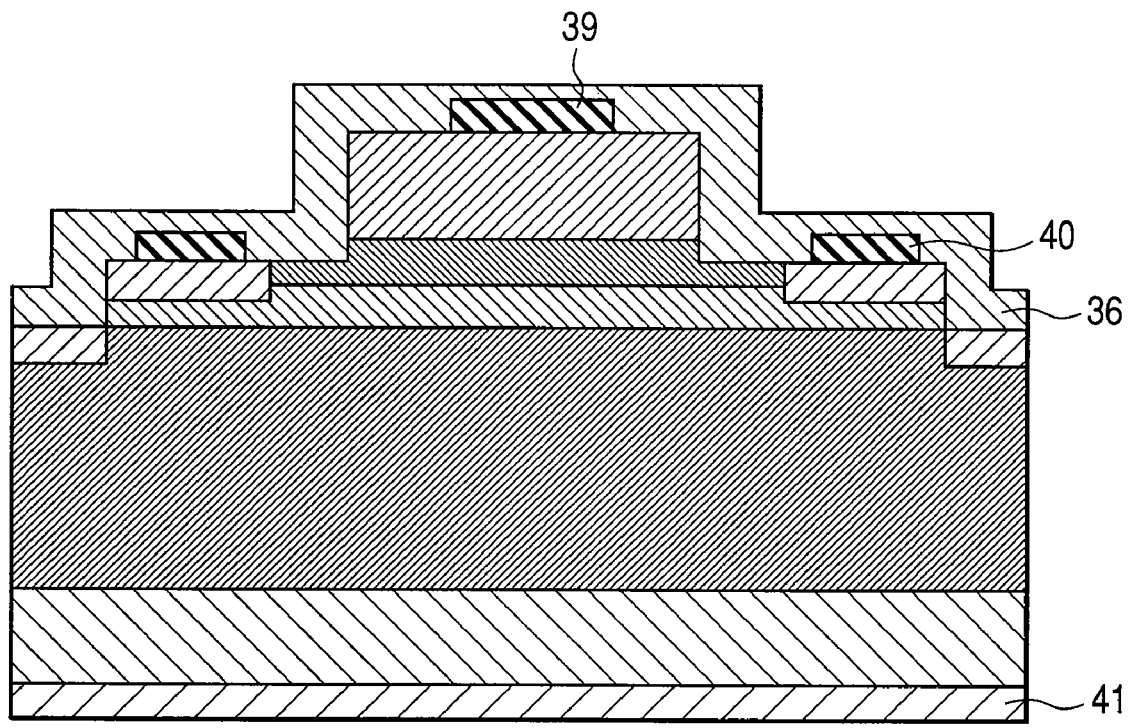
FIG. 16 is a vertical cross sectional structural view showing fabrication steps in a second embodiment of the invention.

Successively, after forming a cathode electrode 41 to the rear face of the SiC substrate 1, the SiO₂ pattern is removed by hydrofluoric acid, an anode electrode 39 and a gate electrode 40 are formed by deposition and lift off, annealing is conducted at about 1500° C., and an SiO₂ film 36 is deposited to the surface (FIG. 16).

Finally, photolithography and SiO₂ dry etching are conducted and Al upper electrodes 42 and 42' are formed to fabricate a thyristor (FIG. 2).

In the thyristor fabricated by the embodiment, it can be confirmed that the turn-on loss is at a negligible level even when the switching frequency is increased to 1 kHz or higher.

According to this embodiment, even when holes injected from the anode to the gate diffuse in the lateral direction, since the ratio of them recombined at the interface recombination centers or bulk recombination centers is decreased to a negligible level, the embodiment provides an effect of attaining a power thyristor that enables high frequency switching at a low turn-on loss.

Embodiment 3

An npn-type SiC bipolar transistor and fabrication steps thereof as a third embodiment of the invention are to be described with reference to FIG. 17 to FIG. 23 and FIG. 29.

FIG. 22 is a vertical cross sectional structural view of an npn-type SiC bipolar transistor as a third embodiment of the invention, FIG. 23 is a plan view thereof, and FIG. 29 is a schematic band diagram at D-D' section in FIG. 22. Above an n-type SiC substrate 51 ((0001) Si surface, donor (N) density: $3\times10^{18}$ cm⁻³), a collector layer 52 comprising an n-type SiC layer (15 μm thickness, donor (N) density: $2\times10^{16}$ cm⁻³), a base layer 53 comprising a p-type SiC (1 μm thickness, acceptor (Al) density: $2\times10^{17}$ cm⁻³), a first emitter layer 54 comprising an n-type SiC (thickness: 100 nm, donor (N) density: $3\times10^{17}$ cm⁻³), a second emitter layer 55 comprising an n-type SiC (15 nm thickness, donor (N) density: $1\times10^{19}$ cm⁻³), a hole barrier layer 63 comprising HfO₂ (1 nm thickness), a conduction band discontinuity relaxed layer 64 comprising amorphous SiN (thickness: 0.5 μm, N/Si ratio being changed gradually as 0.95 at the end of the hole barrier layer 63 and 0.3 at the end of the emitter contact layer 65), and an emitter contact layer 65 comprising polycrystalline Si (0.5 μm thickness, donor (P) density: $5\times10^{20}$ cm⁻³) are formed. Then, the emitter contact layer 65, the conduction band discontinuity relaxed layer 64, the hole barrier layer 63, the second emitter layer 65, the first emitter layer 64 and the base layer 63 form a mesa structure 66. Further, as the ohmic electrodes, an emitter electrode (Ni/Ti) 59 is formed directly to the emitter contact layer 65, a collector electrode (Ni/Ti) 61 is formed directly to the rear face of the n-type SiC substrate 1, and a base electrode (Ti/Al) 60 is formed by way of a base contact region (average Al concentration: $1\times10^{19}$ cm⁻³) 57 formed by Al ion implantation.

In this case, the first emitter layer 54 remains at about 50 nm thickness to the outside of the mesa structure 66 and is present being depleted as a semiconductor region 67 for suppressing recombination. The semiconductor region 67 for suppressing recombination is in contact at the lower surface with the base layer 53 and in contact at the upper surface with the surface passivation layer 56, and has a distance L from the end of the mesa structure 66 to the base contact region equal with or longer than the electron diffusion length in the base layer 3 (3.2 μm at an electron mobility of 400 cm²/Vs and a life of about 10 nm in this embodiment) or more. When L is shorter than the electron diffusion length in the base layer 53, since electrons are captured at the bulk recombination center present in the base contact region 57 and attributable to the ion implantation, the emitter size dependence of the current gain can no more be suppressed.

Now, an example of fabrication steps for the npn-type SiC bipolar transistor shown in FIG. 22 (cross sectional view) and FIG. 23 (plan view) is to be described with reference to vertical cross sectional structural views shown in FIG. 17 to FIG. 22.

Figure 17:
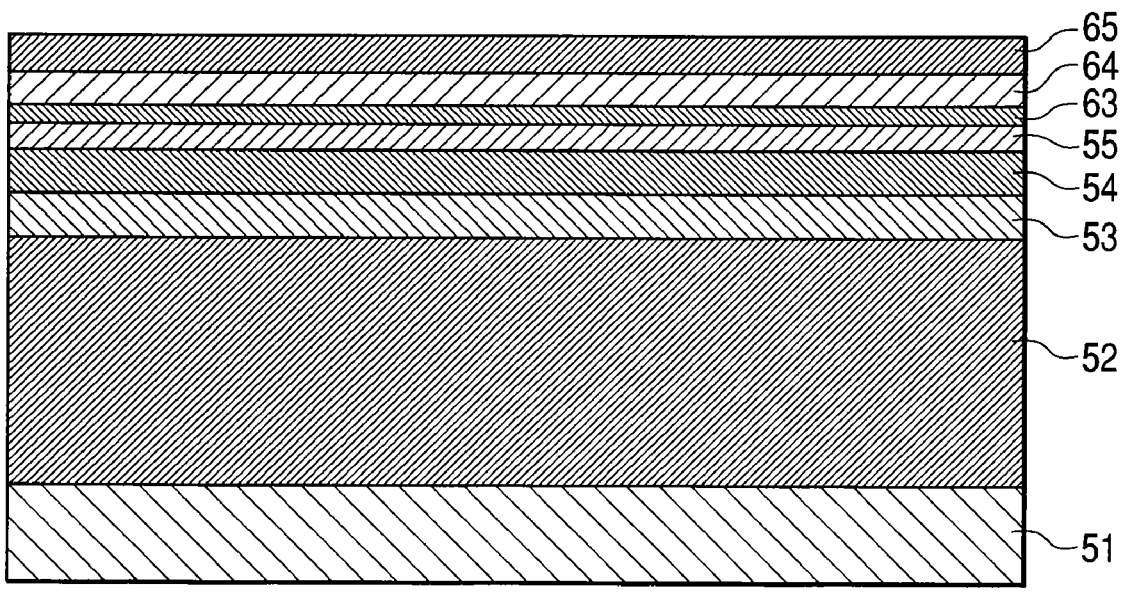
FIG. 17 is a vertical cross sectional structural view showing fabrication steps in a third embodiment of the invention.

At first, above an n-type SiC substrate 51, an n-type SiC collector layer 52, a p-type SiC base layer 53, an n-type SiC first emitter layer 54, and an n-type SiC second emitter layer 55 are epitaxially grown by chemical vapor deposition. Successively, after depositing an HfO₂ hole barrier layer 63 by sputtering, an amorphous SiN conduction band discontinuity relaxed layer 64 and a polycrystalline Si emitter contact layer 65 are formed by chemical vapor deposition (FIG. 17).

Figure 18:
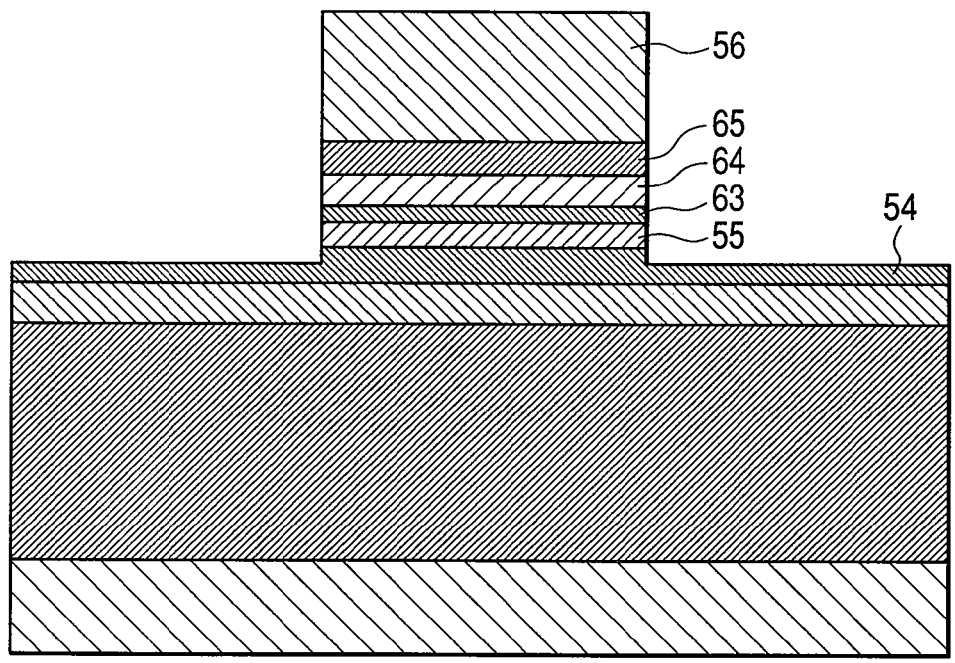
FIG. 18 is a vertical cross sectional structural view showing fabrication steps in a third embodiment of the invention.

Then, an SiO₂ film 56 is deposited and, after photolithography and SiO₂ dry etching, a photoresist is removed to form an SiO₂ pattern. Then, using the SiO₂ pattern as a mask, a first mesa fabrication is conducted by dry etching to the polycrystalline Si emitter contact layer 65, the amorphous SiN conduction band discontinuity relaxed layer 64, the HfO₂ hole barrier layer 63, the n-type SiC second emitter layer 55, and a portion of the n-type SiC first emitter layer 54 (FIG. 18).

Figure 19:
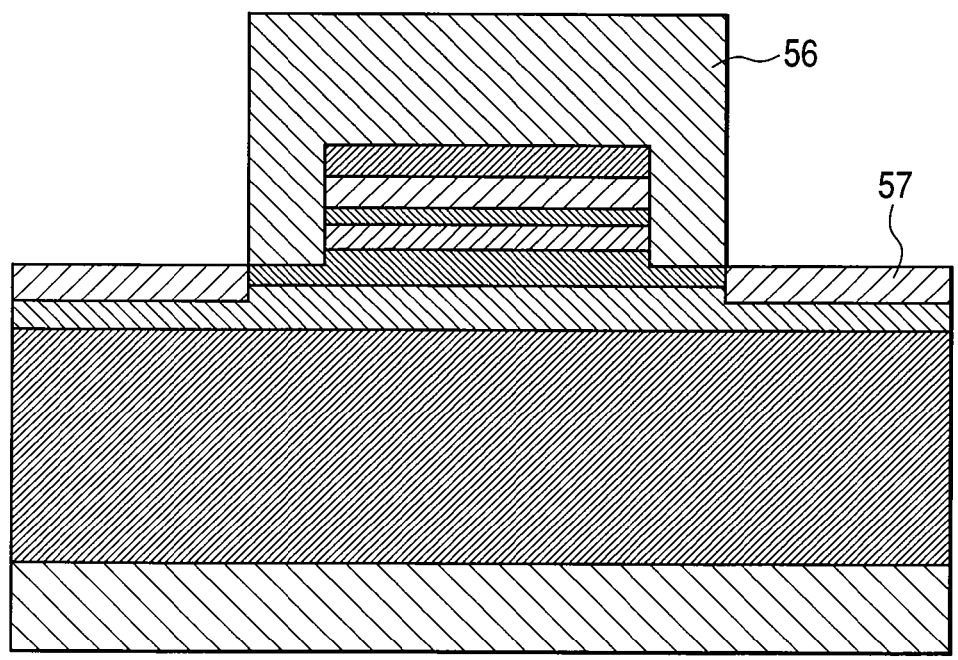
FIG. 19 is a vertical cross sectional structural view showing fabrication steps in the third embodiment of the invention.

Successively, the SiO₂ pattern is removed by hydrofluoric acid, the SiO₂ film 56 is deposited again, an SiO₂ pattern is formed by lithography and SiO₂ dry etching, and Al ion implantation is conducted to a base contact region 57 (FIG. 19).

Figure 20:
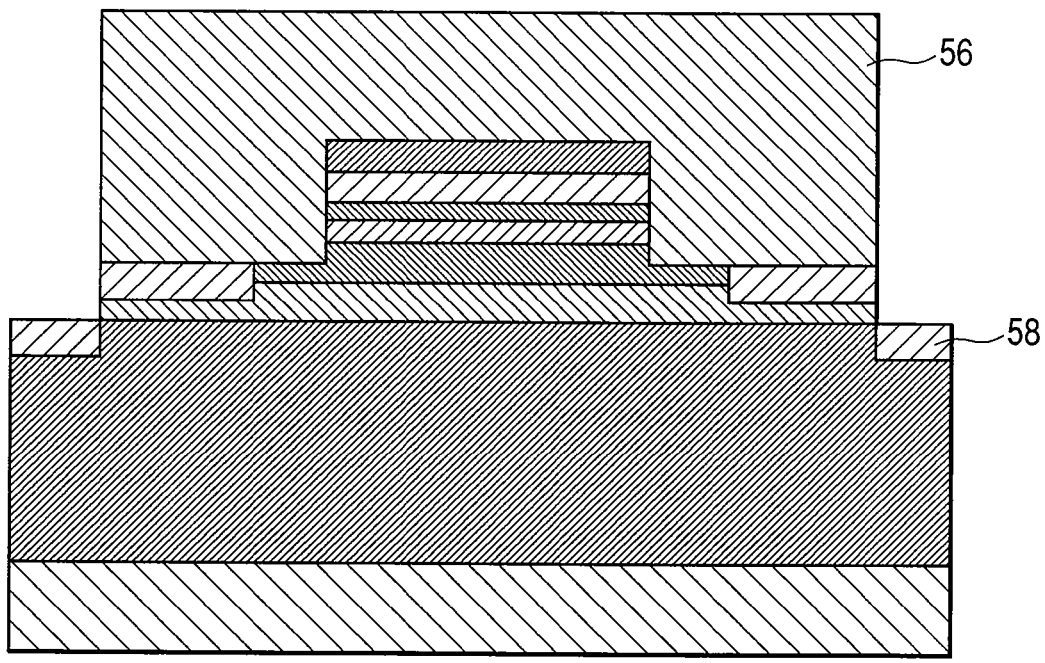
FIG. 20 is a vertical cross sectional structural view showing fabrication steps in the third embodiment of the invention.

Then, SiO₂ is removed by hydrofluoric acid, the SiO₂ film 56 is deposited again, photolithography and SiO₂ dry etching are conducted and the photoresist is removed to form an SiO₂ pattern. Successively, second mesa fabrication is conducted by dry etching of the residue of the first emitter layer 54, and the base layer 53 and a portion of the collector layer 52, and ion implantation for an isolation region 58 is conducted with an aim for electric field relaxation (FIG. 20).

Figure 21:
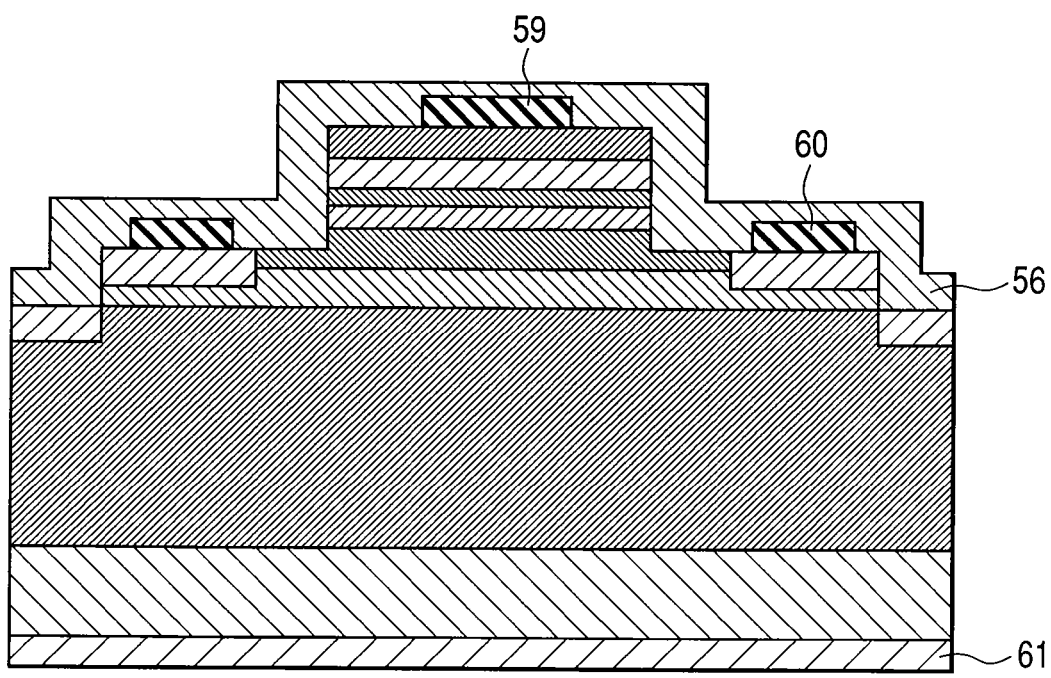
FIG. 21 is a vertical cross sectional structural view showing fabrication steps in the third embodiment of the invention.

Successively, after forming a collector electrode 61 to the rear face of the SiC substrate 51, the SiO$_2$ pattern is removed by hydrofluoric acid, the emitter electrode 59 and the base electrode 60 are formed by deposition and lift off, and annealing is conducted at about 1500° C. to deposit an SiO$_2$ film 56 at the surface (FIG. 21).

Finally, photolithography and SiO$_2$ dry etching are conducted, and Al upper layer electrode 62 and 62' are formed to fabricate a bipolar transistor (FIG. 22).

In the bipolar transistor fabricated according to this embodiment, as shown in FIG. 29, while holes injected from the base layer 53 to the first emitter layer 54 diffuse as far as the second emitter layer 54, they cannot intrude as far as the emitter contact layer 65 due to the hole barrier 63 of a large valance electron band discontinuity amount. As a result, it can be confirmed that the emitter efficiency defined by the ratio of the electron current in the emitter current can be improved and a current gain of about 100 or higher which was difficult to be attained in the existent bipolar transistor using the SiC homojunction can be attained even when the emitter width is decreased to about 3 μm.

According to this embodiment, even when electrons injected from the emitter to the base diffuse laterally, the ratio of them recombined at the interface recombination centers or bulk recombination centers is decreased to a negligible level, and injection of holes from the base to the emitter is also decreased to a negligible level and, as a result, it has an effect of attaining an SiC bipolar transistor that balances extremely high current gain and reduction in the size.

Embodiment 4

Instead of the HfO$_2$ hole barrier layer 63 in Embodiment 3, a hole barrier layer having a stacked structure: SiN/HfO$_2$/SiN is employed. As a result, characteristic variation of HfO$_2$ on every fabrication lot is decreased greatly. For each of the layers in the stacked structure, SiN is defined to 1 nm thickness, HfO$_2$ is defined to 1 nm thickness, and SiN is defined to 1 nm thickness.

This embodiment has an effect of attaining an SiC bipolar transistor that balances an extremely high current gain and reduction in the size at a good reproducibility.

Embodiment 5

Instead of the HfO$_2$ hole barrier layer 63 and the amorphous SiN conduction band discontinuity relaxed layer 64 in Embodiment 3, Al$_x$Ga$_{1-x}$N (5 nm thickness, x being fixed to 0.3 or varied in a range from 0 to 0.3) is used. Generally, not depending on the material for the emitter contact layer, the hole barrier layer, and the second emitter layer, when the amount of conduction band discontinuity for the hole barrier layer, and the emitter contact layer and the second emitter layer exceeds 0.15 eV, since most of electrons in the emitter contact layer are blocked by the hole barrier, the conduction band discontinuity relaxed layer as described in Embodiment 3 is necessary. On the contrary, the amount of conduction band discontinuity of Al$_x$Ga$_{1-x}$N hole barrier layer at x=0.3 with the polycrystalline Si emitter contact layer and the n-type SiC second emitter layer is as small as about 0, the conduction band discontinuity relaxed layer which is necessary for the Embodiment 3 and Embodiment 4 is not necessary. When the amount of the conduction band discontinuity is 0, it may suffice that the thickness of the hole barrier layer may be of such a thickness as capable of controlling the tunneling of holes with a large effective mass, specifically, 1 nm or more with no upper limit for the thickness, irrespective of the material thereof or the material of other layers. When Al$_x$Ga$_{1-x}$N (0<x<0.3) in which the conduction band discontinuity amount is a finite value of 0.15 eV or less is used for the hole barrier layer, it has to be in a thickness capable of electron tunneling and it should be 5 nm or less when the conduction band discontinuity amount is, for example, at 0.15 eV.

In the bipolar transistor fabricated in this embodiment, as shown in the band structural diagram in FIG. 30, while holes injected from the base layer 53 to the first emitter layer 54 diffuse as far as the second emitter layer 54, they cannot intrude as far as the emitter contact layer 65 due to the hole barrier of the valance electron band discontinuity amount. As a result, the emitter efficiency defined by the ratio of the electron current in the emitter current can be improved and it can be confirmed that the current gain of about 100 or higher which was difficult to be attained by the existent bipolar transistor using SiC homojunction can be attained even when the emitter width is decreased to about 3 μm.

This embodiment has an effect of attaining an SiC bipolar transistor that balances an extremely high current gain and reduction in the size at low cost.

Embodiment 6

Figure 24:
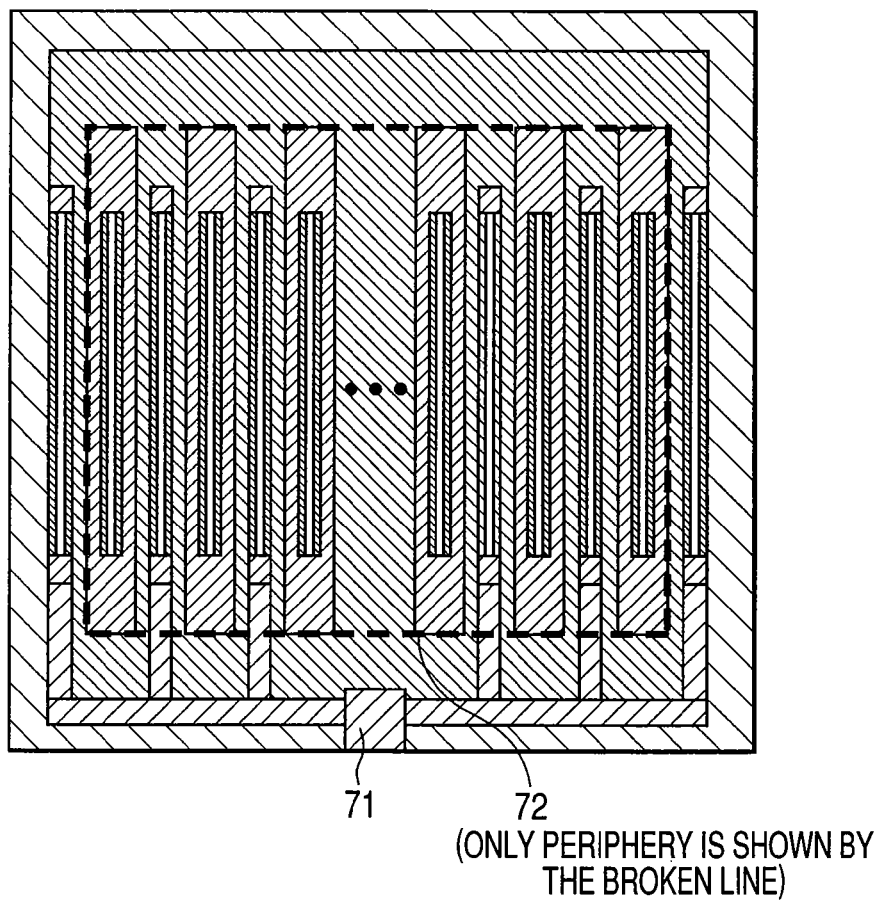
FIG. 24 is a plan view showing a sixth embodiment of the invention.

A multi-finger type bipolar transistor for power switching as a sixth embodiment of the invention is to be described with reference to a plan view of FIG. 24.

In this embodiment, any one type of SiC bipolar transistors described in Embodiments 1, 3 and 4 is arranged in plurality above an n-type SiC substrate, and they are connected in parallel (FIG. 24) to form a multi-finger type bipolar transistor. In FIG. 24, base electrode interconnections are aggregated and collected into a base pad 71. Further, an emitter pad 72 is illustrated as a vacant rectangular form whose periphery is indicated by a broken line for illustrating the emitter electrode interconnection and the base electrode interconnection therebelow. A specific example for the planar constitution of a multi-finger type bipolar transistor is as described below. That is, it has a structure of arranging an emitter electrode 9 or 59, a p-type base contact region 7 or 57 and a base electrode 10 or 60, and the electric field relaxation isolation region 8 or 58 is formed not to every finger but only at the periphery of the chip.

This embodiment has an effect of attaining a multi-finger type bipolar transistor capable of balancing high current gain and reduction in the size and capable of switching high power.

Embodiment 7

An inverter as a seventh embodiment of the invention is to be described with reference to FIG. 25 to FIG. 27.

Figure 25:
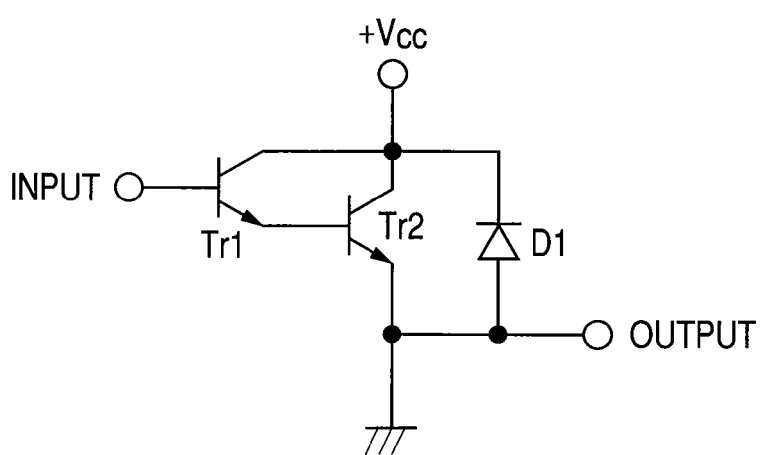
FIG. 25 is an equivalent circuit diagram showing a seventh embodiment of the invention.

FIG. 25 is an equivalent circuit diagram of an inverter according to this embodiment. Both of Tr1 and Tr 2 are multi-finger type bipolar transistors for power switching use shown in Embodiment 6, and a commercially available SiC schottky barrier diode is used for D1. While a current gain effectively exceeding 1,000 is obtained by a Darlington connection of Tr1, Tr2, the Darlington connection may not be used in a case where bipolar transistors having a current gain exceeding 100 shown in Embodiments 3 to 5 are connected in a multi-finger arrangement. Power source voltage +V$_{cc}$ is connected to a terminal in which common collectors for Tr 1 and Tr 2 and the cathode of D1 are connected, the input is connected to the base terminal of Tr1, and the output is connected to a terminal in which the emitter of Tr2 and the anode of D1 are connected, respectively.

Figure 26:
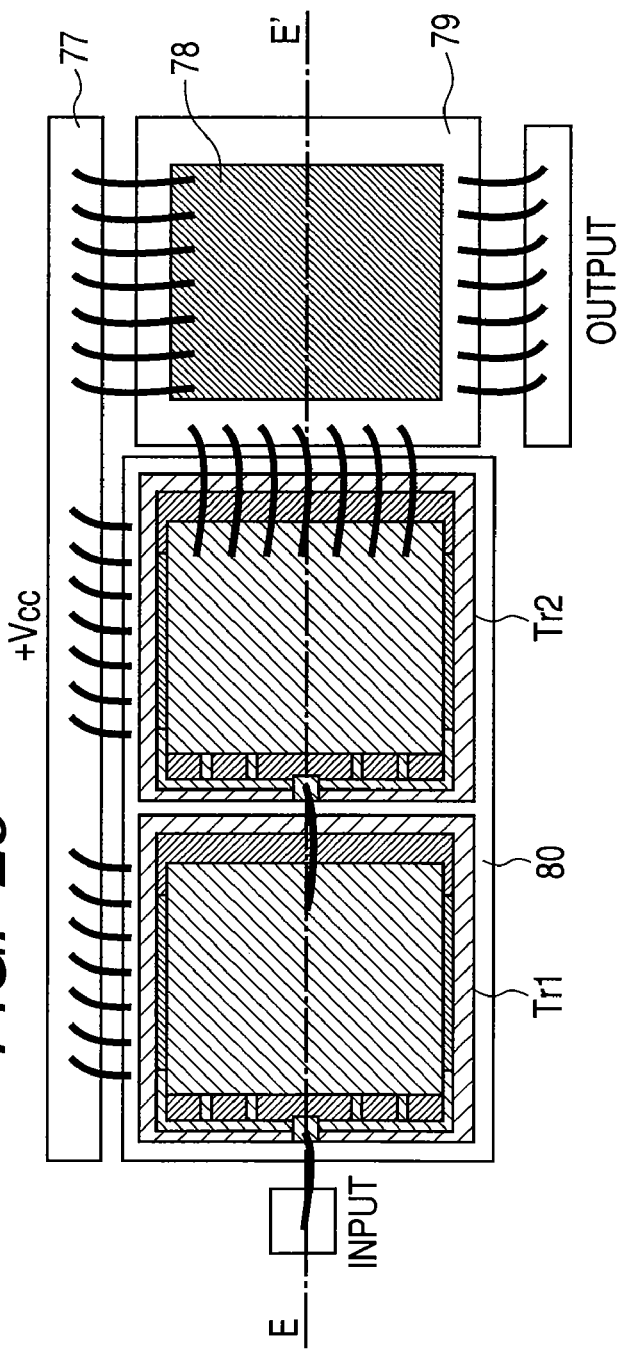
FIG. 26 is a plan view showing the seventh embodiment of the invention.
Figure 27:
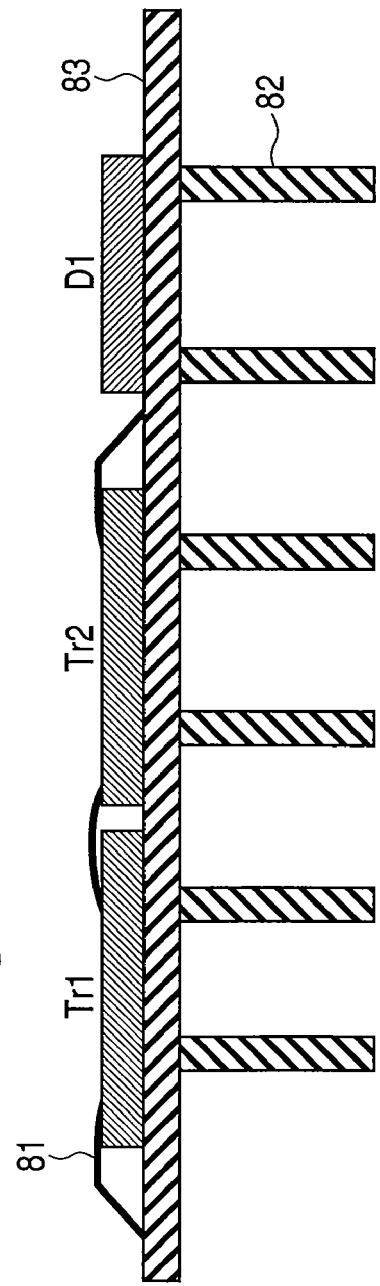
FIG. 27 is a vertical cross sectional structural view at E-E' section in FIG. 26.

FIG. 26 is a plan view of the embodiment packaged in accordance with the circuit diagram of FIG. 25. A cathode electrode 78, an anode electrode connection pattern 79, a collector electrode connection pattern 80, and a bonding wire 81 are shown. Tr1, Tr2, input, output, and $V_{cc}$, etc. show those of the equivalent circuit in FIG. 25. FIG. 27 is a vertical cross sectional structural view at section E-E' in FIG. 26. Each of chips for Tr1, Tr2, and D1 connected electrically on a package substrate 83 having heat radiation fins 82 are connected electrically by way of bonding wires 81, respectively.

This embodiment has an effect of attaining an inverter with low loss as a result of adopting a multi-finger type bipolar transistors capable of balancing high current gain and reduction in the size and capable of high power switching.

DESCRIPTION OF REFERENCES 1, 31, 51, 91, 111 . . . substrate,
2, 52, 29 . . . collector layer,
3, 53, 93 . . . base layer,
4, 5, 54, 55, 94, 95 . . . emitter layer,
6, 36, 56, 96, 116 . . . surface passivation layer,
7, 57, 97 . . . base contact region,
8, 38, 58, 98, 118 . . . electric field relaxation isolation region,
9, 59, 99 . . . emitter electrode,
10, 60, 100 . . . base electrode,
11, 61, 101 . . . collector electrode,
12, 42, 62, 102, 122 . . . upper layer electrode,
13, 17, 43, 47, 66, 103, 107, 123, 127 . . . mesa structure,
14, 44, 67, 105, 125 . . . semiconductor region for suppressing recombination,
32, 112 . . . drift layer,
33, 113 . . . gate layer,
34, 35, 114, 115 . . . anode layer,
37, 117 . . . gate contact region,
39, 119 . . . anode electrode,
40, 120 . . . gate electrode,
41, 121 . . . cathode electrode,
104, 124 . . . interface recombination center,
106, 126 . . . bulk interface recombination center,
63 . . . hole barrier layer,
64 . . . conduction band discontinuity relaxed layer,
65 . . . emitter contact layer,
71 . . . base pad,
72 . . . emitter pad,
77 . . . power source line pattern,
78 . . . cathode electrode,
79 . . . anode electrode connection pattern,
80 . . . collector electrode connection pattern,
81 . . . bonding wire,
82 . . . radiation fin,
83 . . . package substrate.

What is claimed is:

1. A bipolar transistor including a base layer comprising a p-type semiconductor, a first emitter layer comprising an n-type semiconductor, and a second emitter layer comprising an n-type semiconductor with a donor density being higher compared with that of the first emitter layer are stacked successively, having a portion of the first emitter layer, the second emitter layer, and a surface passivation layer in a mesa structure, and having a base-contact region disposed to the periphery of the second emitter layer sandwiching a semiconductor region for suppressing recombination and connected electrically with the base layer, wherein the semiconductor region for suppressing recombination comprises an identical semiconductor having a donor density identical with that of the first emitter layer and is present in contact with the base layer and the surface passivation layer, and the width of the semiconductor region for suppressing recombination is equal with or longer than the electron diffusion length in the base layer.

2. A thyristor including a gate layer comprising an n-type semiconductor, a first anode layer comprising a p-type semiconductor, and a second anode layer comprising a p-type semiconductor with an acceptor density being higher compared with that of the first anode layer are stacked successively, having a portion of the first anode layer, the second anode layer, and a surface passivation layer in a mesa structure, and having a gate-contact region disposed to the periphery of the second anode layer sandwiching a semiconductor region for suppressing recombination and connected electrically with the gate layer, wherein the semiconductor region for suppressing recombination comprises an identical semiconductor having an acceptor density identical with that of the first anode layer and is present in contact with the gate layer and the surface passivation layer, and the width of the semiconductor region for suppressing recombination is equal with or longer than the hole diffusion length in the gate layer.

3. The bipolar transistor according to claim 1, wherein a hole barrier layer and an emitter contact layer are further stacked successively above the second emitter layer.

4. The bipolar transistor according to claim 1, wherein a hole barrier layer, a conduction band discontinuity relaxed layer, and an emitter contact layer are further stacked successively above the second emitter layer.

5. The bipolar transistor according to claim 1, wherein each of the base layer, the first emitter layer, and the second emitter layer comprises SiC.

6. The bipolar transistor according to claim 3, wherein each of the base layer, the first emitter layer, and the second emitter layer comprises SiC.

7. The bipolar transistor according to claim 4, wherein each of the base layer, the first emitter layer, and the second emitter layer comprises SiC.

8. The thyristor according to claim 2, wherein each of the gate layer, the first anode layer, and the second anode layer comprises SiC.

9. The bipolar transistor according to claim 3, wherein the emitter contact layer comprises polycrystalline Si.

10. The bipolar transistor according to claim 5, wherein the emitter contact layer comprises polycrystalline Si.

11. The bipolar transistor according to claim 3, wherein the hole barrier layer comprises an AlGaN alloy.

12. The bipolar transistor according to claim 4, wherein the hole barrier layer comprises an AlGaN alloy.

13. The bipolar transistor according to claim 3, wherein the hole barrier layer comprises $HfO_2$, or $HfO_2$ which is sandwiched at the opposing surfaces thereof with SiN.

14. The bipolar transistor according to claim 4, wherein the hole barrier layer comprises $HfO_2$, or $HfO_2$ which is sandwiched at the opposing surfaces thereof with SiN.

15. The bipolar transistor according to claim 4, wherein the conduction band discontinuity relaxed layer comprises SiN.

* * * * *